United States Patent
Sato

(10) Patent No.: US 12,315,838 B2
(45) Date of Patent: May 27, 2025

(54) WIRING STRUCTURE AND SEMICONDUCTOR MODULE

(71) Applicant: FUJI ELECTRIC CO., LTD., Kawasaki (JP)

(72) Inventor: Tadahiko Sato, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 189 days.

(21) Appl. No.: 17/187,620

(22) Filed: Feb. 26, 2021

(65) Prior Publication Data
US 2021/0288016 A1 Sep. 16, 2021

(30) Foreign Application Priority Data

Mar. 13, 2020 (JP) ................................. 2020-043933

(51) Int. Cl.
*H01L 23/498* (2006.01)
*H01L 23/00* (2006.01)
(Continued)

(52) U.S. Cl.
CPC .............. *H01L 24/40* (2013.01); *H01L 23/04* (2013.01); *H01L 23/053* (2013.01);
(Continued)

(58) Field of Classification Search
CPC .................... H01L 2224/40135–40141; H01L 2224/40153–40195;
(Continued)

(56) References Cited

U.S. PATENT DOCUMENTS

| 2007/0138624 | A1* | 6/2007 | Sudo | H01L 25/072 257/E23.125 |
| 2009/0321900 | A1 | 12/2009 | Yoshida et al. | |
| 2009/0321990 | A1* | 12/2009 | Heidari | G03F 7/0002 425/436 RM |
| 2013/0082334 | A1 | 4/2013 | Nakamura | |
| 2013/0105985 | A1* | 5/2013 | Tsuruoka | H01L 23/492 257/773 |

(Continued)

FOREIGN PATENT DOCUMENTS

| JP | 2005183568 A | 7/2005 |
| JP | 2006202885 A | 8/2006 |

(Continued)

OTHER PUBLICATIONS

Japanese Office Action dated Jan. 9, 2024, in the counterpart Japanese patent application No. 2020-043933.

*Primary Examiner* — Lauren R Bell
(74) *Attorney, Agent, or Firm* — Rabin & Berdo, P.C.

(57) ABSTRACT

A lead frame structure for connecting a semiconductor chip to a connection target includes a conductive member electrically connecting the semiconductor chip and the connection target. The conductive member includes a first bonding part having a main surface, disposed on one side of the conductive member and being bonded to the semiconductor chip, a second bonding part having a main surface, being disposed on another side of the conductive member that is spaced from the one side in one direction and being bonded to the connection target, and a joining part having a wall section intersecting the main surface of the first bonding part and the main surface of the second bonding part, the wall section joining a portion of the first bonding part to a portion of the second bonding part.

16 Claims, 13 Drawing Sheets

(51) Int. Cl.
*H01L 23/04* (2006.01)
*H01L 23/053* (2006.01)
*H01L 23/14* (2006.01)

(52) U.S. Cl.
CPC ........ *H01L 23/49811* (2013.01); *H01L 24/37* (2013.01); *H01L 23/142* (2013.01); *H01L 24/48* (2013.01); *H01L 24/73* (2013.01); *H01L 2224/37011* (2013.01); *H01L 2224/37012* (2013.01); *H01L 2224/40091* (2013.01); *H01L 2224/40101* (2013.01); *H01L 2224/40227* (2013.01); *H01L 2224/48106* (2013.01); *H01L 2224/48228* (2013.01); *H01L 2224/73221* (2013.01)

(58) Field of Classification Search
CPC ... H01L 2224/3701–37013; H01L 2224/4005; H01L 2224/4009–40095; H01L 2224/4007

See application file for complete search history.

(56) References Cited

U.S. PATENT DOCUMENTS

| | | | |
|---|---|---|---|
| 2016/0322342 | A1* | 11/2016 | Kimura ................. H01L 23/142 |
| 2017/0077044 | A1 | 3/2017 | Soyano |
| 2019/0157221 | A1 | 5/2019 | Soyano et al. |
| 2020/0083129 | A1* | 3/2020 | Fujino ................. H01L 23/3121 |
| 2020/0098701 | A1 | 3/2020 | Harada et al. |

FOREIGN PATENT DOCUMENTS

| | | |
|---|---|---|
| JP | 2008153432 A | 7/2008 |
| JP | 2010010330 A | 1/2010 |
| JP | 2013074264 A | 4/2013 |
| JP | 2013131592 A | 7/2013 |
| JP | 2015153839 A | 8/2015 |
| WO | 2016084622 A1 | 6/2016 |
| WO | 2018142863 A1 | 8/2018 |
| WO | 2018146780 A1 | 8/2018 |
| WO | 2018207656 A1 | 11/2018 |

* cited by examiner

WIRING STRUCTURE AND SEMICONDUCTOR MODULE

CROSS REFERENCE TO RELATED APPLICATIONS

This application is based upon and claims the benefit of priority of the prior Japanese Patent Application No. 2020-043933, filed on Mar. 13, 2020, the entire contents of which are incorporated herein by reference.

BACKGROUND OF THE INVENTION

Field of the Invention

The present invention relates to a wiring structure and a semiconductor module.

Description of the Related Art

A semiconductor module is provided with a semiconductor chip on which components such as an insulated-gate bipolar transistor (IGBT), a power metal-oxide-semiconductor field effect transistor (MOSFET), and a free-wheeling diode (FWD) are formed, and is used for industrial applications such as in a motor driving control inverter of an elevator or other apparatus. Furthermore, in recent years, semiconductor modules are also being used widely in vehicle motor driving control inverters. There are demands for vehicle motor driving control inverters to be more compact and lightweight for improved fuel efficiency and to have better long-term reliability in high-temperature operating environments for installation inside an engine compartment.

To meet such demands for a more compact and lightweight configuration having long-term reliability in high-temperature operating environments, a semiconductor module in which a semiconductor chip and electrode patterns are connected by a metal plate wiring method is known. The metal plate wiring method refers to a method of using metal plate wiring formed by molding a metal plate to support and secure the semiconductor chip and also establish connections between the semiconductor chip and electrode patterns or the like. In the past, to prevent unfilled regions of an encapsulating resin from occurring in a semiconductor module using such a metal plate wiring method, a technology has been proposed in which a wiring part of the metal plate wiring is provided with through-holes fillable with an insulating resin (for example, see Japanese Patent Laid-open No. 2006-202885).

However, in the semiconductor module described in Japanese Patent Laid-open No. 2006-202885, in the case of connecting a bonding wire at the same potential from a portion of the metal plate wiring such as an auxiliary emitter electrode, it is necessary to draw out the bonding wire so as to pass above the metal plate wiring. In this case, a portion of the bonding wire is disposed above the metal plate wiring, which makes it difficult to lower the profile of the semiconductor module.

The present invention has been devised in light of such points, and one object thereof is to provide a wiring structure and a semiconductor module with which a low-profile semiconductor module can be attained.

SUMMARY OF THE INVENTION

A wiring structure according to the embodiment is a wiring structure that electrically connects a semiconductor chip and a connection target of the semiconductor chip, and includes a first bonding part that is disposed on one side of a conductive member and bonded to the semiconductor chip, a second bonding part that is disposed on another side of the conductive member and bonded to the connection target, and a joining part that joins the first bonding part and the second bonding part. The joining part has wall sections intersecting main surfaces of the first bonding part and the second bonding part, and the wall sections join a portion of the first bonding part to a portion of the second bonding part.

Advantageous Effects of Invention

According to the present invention, a low-profile semiconductor module can be attained.

DETAILED DESCRIPTION OF THE PREFERRED EMBODIMENTS

To meet the demands for a more compact and lightweight configuration having long-term reliability in high-temperature operating environments for a semiconductor module used in an apparatus such as a vehicle motor driving control inverter, the adoption of a metal plate wiring method in which a semiconductor chip and electrode patterns are connected by metal plate wiring is known. Hereinafter, the configuration in the area surrounding a metal plate according to the metal plate wiring method of the related art will be described with reference to FIGS. 13A and 13B. Note that the metal plate used in the metal plate wiring method may also be referred to as a lead frame. In the following, a conductive member used in the metal plate wiring method will also be referred to as the lead frame where appropriate.

Figure 13A:
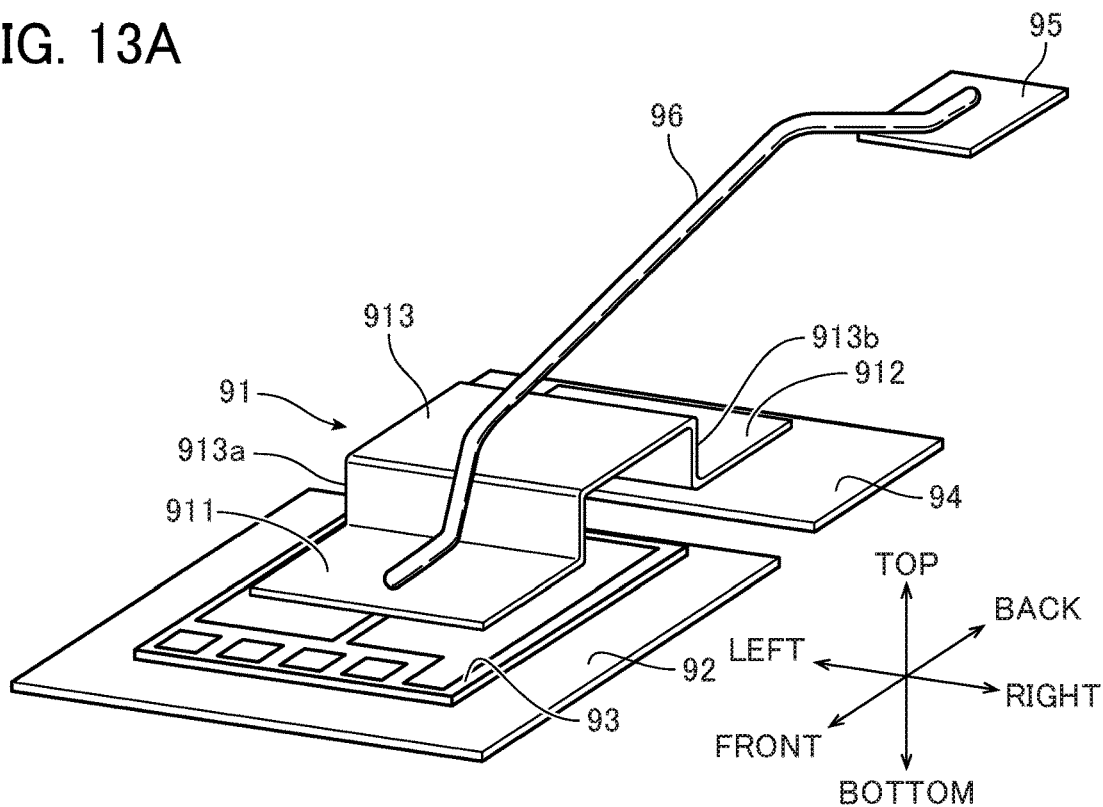
FIGS. 13A and 13B are enlarged view of the area surrounding a metal plate in a metal plate wiring method of the related art.
Figure 13B:
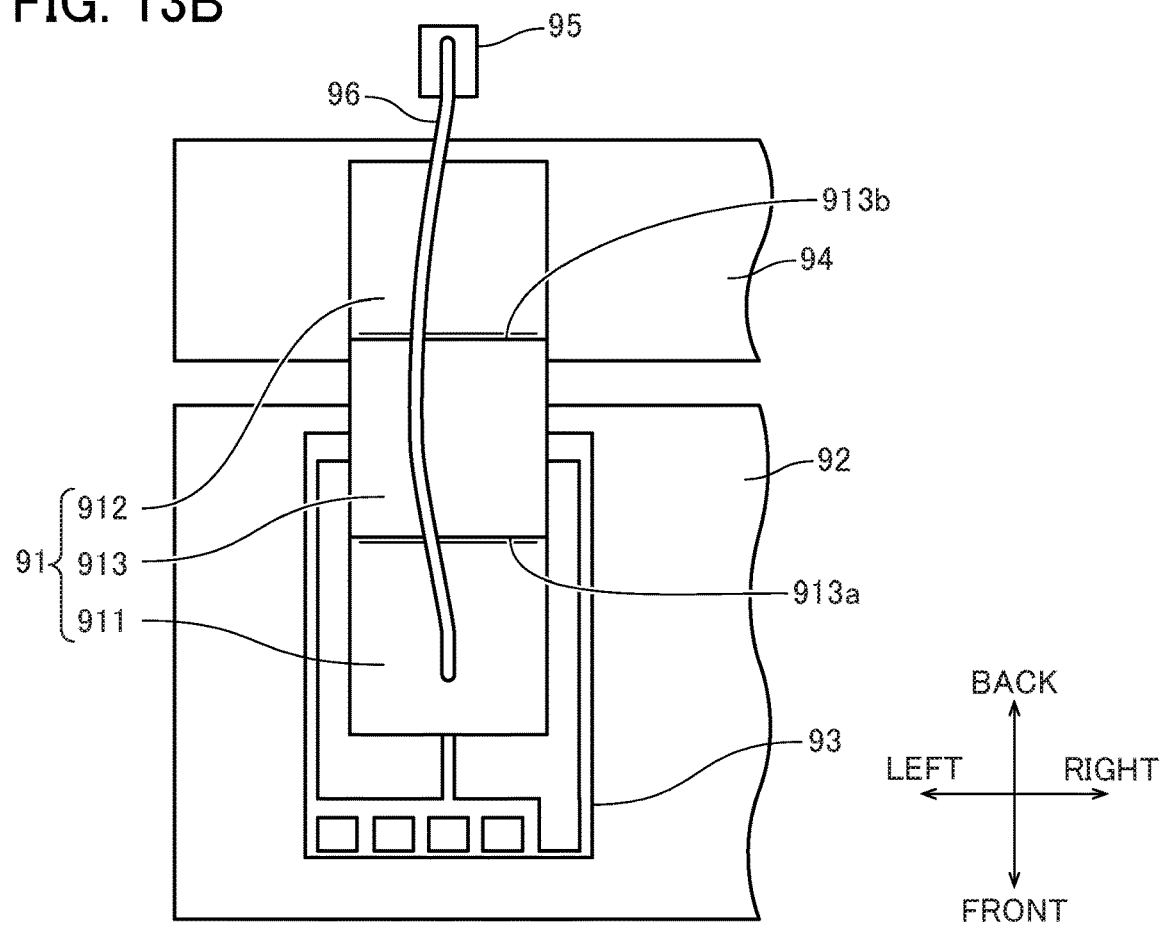

FIGS. 13A and 13B are enlarged views of the area surrounding a metal plate in the metal plate wiring method of the related art. FIGS. 13A and 13B illustrate a perspective view and a top view, respectively, of the configuration of the metal plate wiring of the related art. Here, for convenience, the vertical direction, the transverse direction, and the longitudinal direction illustrated in FIGS. 13A and 13B will be described as the vertical direction, the transverse direction, and the longitudinal direction of the metal plate (lead frame).

As illustrated in FIGS. 13A and 13B for example, a lead frame 91 is bonded to a semiconductor chip 93 provided on an electrode pattern 92 and an electrode pattern 94 disposed separately from the electrode pattern 92, electrically connecting the two. The electrode patterns 92 and 94 are provided on an insulating substrate not illustrated. The semiconductor chip 93 is bonded to the top face of the electrode pattern 92 by solder not illustrated.

The lead frame 91 is formed by bending a metal plate into a shape that generally extends in a horizontal direction (the longitudinal direction illustrated in FIGS. 13A and 13B) and also bends or curves downward at the front and back ends thereof. More specifically, the lead frame 91 has a first bonding part 911 which is provided on one end (the front end) and is bonded to the top face of the semiconductor chip 93, a second bonding part 912 which is provided on the other end (the back end) of the lead frame 91 and is bonded to the top face of the electrode pattern 94, and a joining part 913 that joins the first bonding part 911 and the second bonding part 912.

The joining part 913 has a hanging part 913a disposed higher than the first bonding part 911, and provided so as to hang down from the front edge of the joining part 913. The hanging part 913a is connected to the back edge of the first bonding part 911. Similarly, the joining part 913 has a hanging part 913b disposed higher than the second bonding part 912, and provided so as to hang down from the back edge of the joining part 913. The first bonding part 911 and the second bonding part 912 are parallel to each other. The first bonding part 911 is disposed at a higher position than the second bonding part 912 for example, but is not limited thereto.

In FIGS. 13A and 13B, a metal terminal 95 is provided opposite the electrode pattern 92 with the electrode pattern 94 in between. The metal terminal 95 is embedded in a resin case not illustrated. A bonding wire 96 is connected between the metal terminal 95 and the top face of the first bonding part 911. The bonding wire 96 is drawn out from the first bonding part 911 (or the metal terminal 95) so as to pass above the joining part 913 and be connected to the metal terminal 95 (or the first bonding part 911). In this case, a portion of the bonding wire 96 is disposed above the lead frame 91, which makes it difficult to lower the profile of the semiconductor module.

The inventor focused on the configuration of the lead frame 91 in which the joining part 913 that joins the first bonding part 911 and the second bonding part 912 is disposed so as to extend substantially parallel to the first bonding part 911 and the second bonding part 912 at a position above the first bonding part 911 and the second bonding part 912, which is a factor that hinders the lowering of the profile of the semiconductor module. The inventor then discovered that the adoption of a configuration of the lead frame 91 that does not impede the drawing-out of the bonding wire 96 contributes to lowering the profile of the semiconductor module, and thereby conceived of the present invention.

Namely, the gist of the present invention is that, in a wiring structure having a first bonding part that is bonded to a semiconductor chip disposed on one side of a lead frame (conductive member), a second bonding part that is bonded to a connection target disposed on the other side of the lead frame, and a joining part that joins the first bonding part and the second bonding part, the joining part has wall sections intersecting the main surfaces of the first bonding part and the second bonding part, such that a portion of the first bonding part and a portion of the second bonding part are joined by the wall sections.

According to the present invention, because a portion of the first bonding part and a portion of the second bonding part are joined by wall sections intersecting the main surfaces of the first bonding part and the second bonding part, the joining part is not disposed so as to extend substantially parallel to the first bonding part and the second bonding part at a position above the first bonding part and the second bonding part. Consequently, a bonding wire can be drawn out using a space that overlaps with the wall sections forming the joining part as seen in a side view. As a result, the bonding wire can be disposed at a low position, and therefore a low-profile semiconductor module can be attained.

Hereinafter, a configuration of a semiconductor module applying a wiring structure according to embodiments of the present invention will be described with reference to the drawings.

First Embodiment

Figure 1:
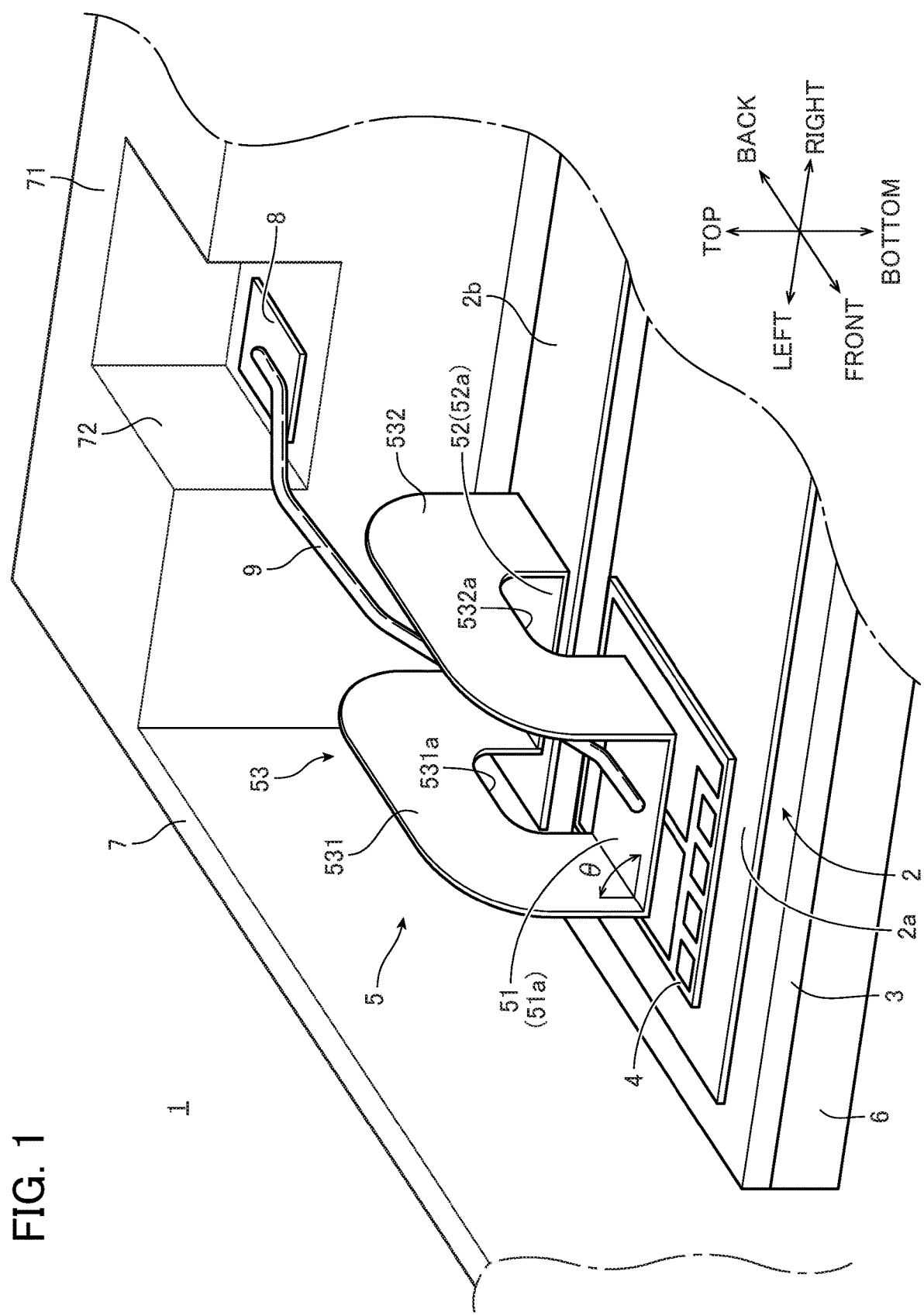
FIG. 1 is a perspective view illustrating a configuration of a semiconductor module applying a wiring structure according to a first embodiment of the present invention.

FIG. 1 is a perspective view illustrating a configuration of a semiconductor module 1 applying a wiring structure according to a first embodiment of the present invention. In the following, for convenience, the longitudinal direction, the vertical direction, and the transverse direction illustrated in FIG. 1 will be described as the longitudinal direction, the vertical direction, and the transverse direction of the semiconductor module 1. However, the vertical direction used in this specification is not necessarily limited to the gravitational direction.

As illustrated in FIG. 1, the semiconductor module 1 is provided with an insulating substrate 3 having electrode patterns 2 (2a and 2b) provided on the top face thereof. The electrode patterns 2a and 2b are disposed separately from each other on the top face of the insulating substrate 3. For example, the electrode patterns 2a and 2b are formed using a foil or plate of a metal such as copper (Cu) or aluminum (Al). A layer of material such as nickel (Ni) plating may also be provided on the electrode patterns 2. Note that the electrode pattern 2b is an example of a connection target of a lead frame 5 described later.

A semiconductor chip 4 is bonded to the top face of the electrode pattern 2a by solder not illustrated. For example, the semiconductor chip 4 contains one or more semiconductor elements, which may include a switching element such as an insulated-gate bipolar transistor (IGBT) or a power metal-oxide-semiconductor field-effect transistor (power MOSFET), or a diode such as a free-wheeling diode (FWD). The semiconductor chip 4 may also contain a semiconductor element such as a reverse-conducting IGBT (RC-IGBT) that combines an IGBT and an FWD, or a reverse-blocking IGBT (RB-IGBT) having a sufficient withstand voltage with respect to reverse bias. The semiconductor chip 4 preferably is formed using a semiconductor substrate such as silicon (Si), silicon carbide (Sic), or gallium nitride (GaN).

A lead frame 5 is bonded as an electrical interconnect onto the top face of the semiconductor chip 4 and the electrode pattern 2b. The lead frame 5 is formed by bending a metal plate into a shape that generally extends in a horizontal direction (the longitudinal direction illustrated in FIG. 1). The lead frame 5 is electrically connected to the semiconductor chip 4 disposed on one side (the front side illustrated in FIG. 1) and to the electrode pattern 2b disposed on the other side (the back side illustrated in FIG. 1). Note that the configuration of the lead frame 5 will be described later.

An electrode pattern not illustrated is provided on the bottom face of the insulating substrate 3. The electrode pattern is soldered to the bottom face of the insulating substrate 3. The insulating substrate 3 is bonded (soldered) to a metal substrate 6 with the electrode pattern in between. For example, the metal substrate 6 has heatsink fins not illustrated, and acts to radiate heat produced in association with the driving of the semiconductor module 1.

The semiconductor module 1 is provided with a resin case 7 that houses the members forming the module. The resin case 7 has a shape that is open on top. A metal terminal 8 is embedded in a portion of the resin case 7. One portion of the metal terminal 8 is exposed from the top face of a recessed section 72 provided in a back face 71 of the resin case 7, while another portion is exposed from an outer wall of the back face 71 (for example, the outer wall on the back side illustrated in FIG. 1). A bonding wire 9 is connected between the portion of the metal terminal 8 exposed from the top face of the recessed section 72 and the top face of a bonding part 51 of the lead frame 5 described later.

The components of the semiconductor module 1 formed as described above are placed in inside the resin case 7. With the components placed in this way, the interior of the resin case 7 is filled with an encapsulating resin (not illustrated) containing a curing resin such as epoxy, a silicon gel, or the like. By filling the interior of the resin case 7 with the encapsulating resin in this way, the semiconductor chip 4 and the like are insulated and protected.

Figure 2:
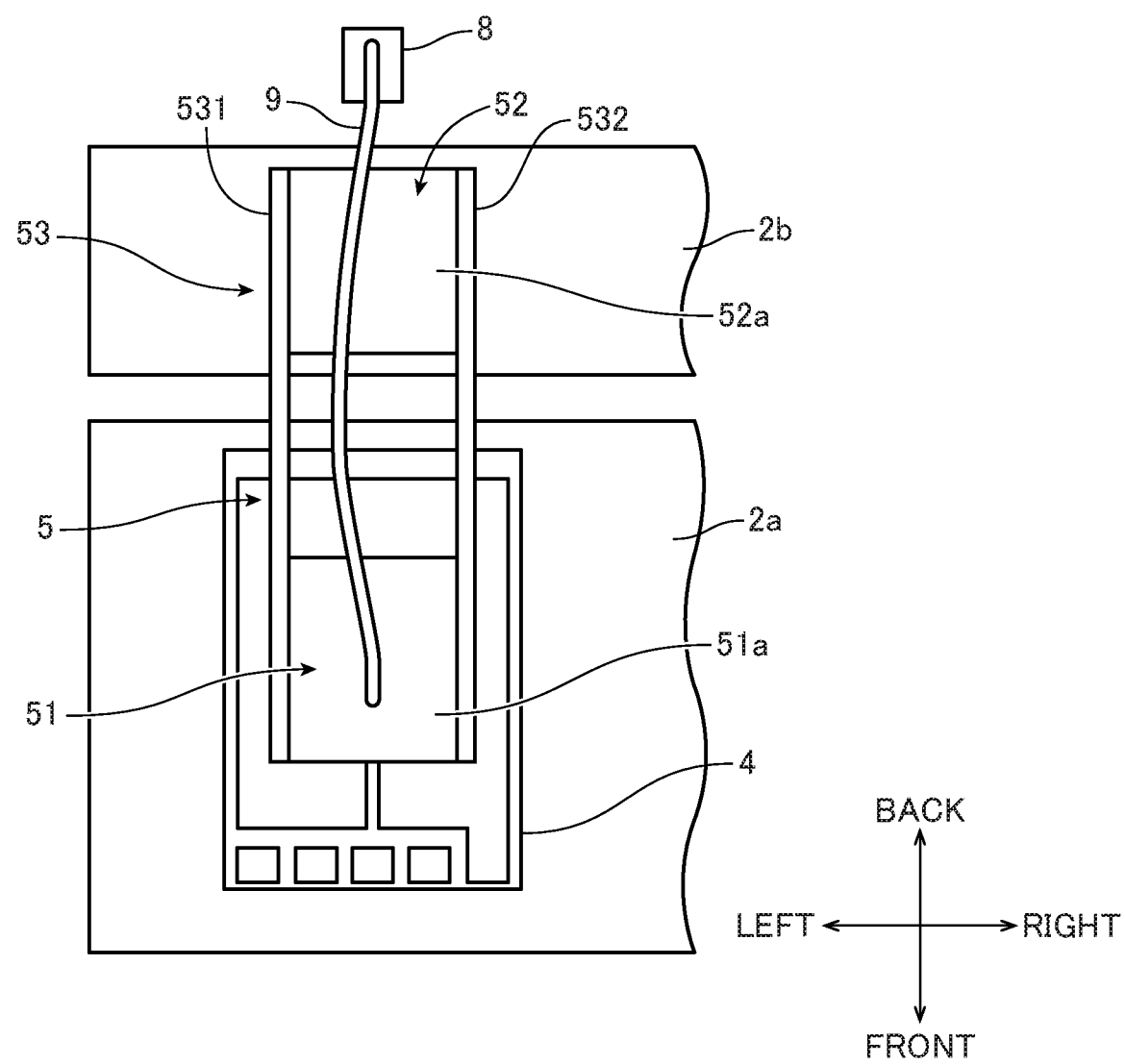
FIG. 2 is a plan view of the area surrounding a conductive member included in a semiconductor module according to the first embodiment.

At this point, the configuration of the lead frame 5 included in the semiconductor module 1 according to the present embodiment will be described with reference to FIGS. 1 and 2. FIG. 2 is a plan view of the area surrounding the lead frame 5 included in the semiconductor module 1 according to the first embodiment. In FIG. 2, portions of the configuration shared in common with FIG. 1 are denoted with the same signs, and further description of such portions is omitted.

As illustrated in FIGS. 1 and 2, the lead frame 5 has a bonding part 51 which is provided on one end (the front end) and is bonded to the top face of the semiconductor chip 4, a bonding part 52 which is provided on the other end (the back end) of the lead frame 5 and bonded to the top face of the electrode pattern 2b, and a joining part 53 that joins the bonding part 51 and the bonding part 52. The bonding part 51 is an example of the first bonding part, and the bonding part 52 is an example of the second bonding part.

The bonding part 51 is bonded to the top face of the semiconductor chip 4 by solder. The bonding part 51 has a main surface 51a that extends in the longitudinal direction and the transverse direction. Here, the main surface 51a refers to the face having the largest surface area as well as its opposite face from among the faces of the bonding part 51. The bonding part 52 is bonded to the top face of the electrode pattern 2b by solder. The bonding part 52 has a main surface 52a that extends in the longitudinal direction and the transverse direction. Here, the main surface 52a refers to the face having the largest surface area as well as its opposite face from among the faces of the bonding part 52. The electrode pattern 2b is an example of a connection target of the bonding part 52. Note that the connection target of the bonding part 52 is not limited to the electrode pattern 2b and may also include parts of the configuration such as an external terminal of the semiconductor module 1 or another semiconductor chip.

The joining part 53 has a pair of wall sections 531 and 532 that intersect the main surface 51a of the bonding part 51 and the main surface 52a of the bonding part 52. The wall sections 531 and 532 are provided such that the surfaces of the wall sections 531 and 532 extend in a direction orthogonal to (more specifically, upward from) the main surface 51a of the bonding part 51 and the main surface 52a of the bonding part 52. However, the configuration of the wall sections 531 and 532 is not limited thereto. For example, the wall sections 531 and 532 may also be provided so as to extend in oblique directions with respect to the main surface 51a of the bonding part 51 and the main surface 52a of the bonding part 52.

The wall sections 531 and 532 each join a portion of the main surface 51a of the bonding part 51 to a portion of the main surface 52a of the bonding part 52. In the semiconductor module 1 according to the present embodiment, the wall section 531 joins the edge on the left side (left edge) of the main surface 51a of the bonding part 51 to the left edge of the main surface 52a of the bonding part 52. Similarly, the wall section 532 joins the edge on the right side (right edge) of the main surface 51a of the bonding part 51 to the right edge of the main surface 52a of the bonding part 52.

An opening 531a is provided in the middle of a lower portion of the wall section 531. The opening 531a opens downward (toward the bonding parts 51 and 52) in the space between the bonding part 51 and the bonding part 52 (the space between the two in the longitudinal direction). By providing the opening 531a in this way, the wall section 531 has an arch or crescent shape, and is configured to join the left edge of the main surface 51a of the bonding part 51 to the left edge of the bonding part 52 along an arched or crescent-shaped path. In other words, the front lower end and the back lower end of the wall section 531 are connected to the bonding part 51 and the bonding part 52, respectively, and the wall section 531 extends away from the bonding part 51 and the bonding part 52 in the region between the two.

Similarly, an opening 532a is provided in a lower portion of the wall section 531. The opening 532a opens downward (toward the bonding parts 51 and 52) in the space between the bonding part 51 and the bonding part 52 (the space between the two in the longitudinal direction). By providing the opening 532a in this way, the wall section 532 has an arch or crescent shape, and is configured to join the right edge of the main surface 51a of the bonding part 51 to the right edge of the bonding part 52 along an arched or crescent-shaped path. In other words, the front lower end and the back lower end of the wall section 532 are connected to the bonding part 51 and the bonding part 52, respectively, and the wall section 532 extends away from the bonding part 51 and the bonding part 52 in the region between the two.

Note that in the semiconductor module 1 according to the present embodiment, a case where the wall sections 531 and 532 forming the joining part 53 are planar is described (see FIGS. 1 and 2), but the shape of the wall sections 531 and 532 is not limited thereto and may be changed where appropriate. For example, the wall sections 531 and 532 may also have a partially bent or curved shape, insofar as the drawing-out of the bonding wire 9 is unaffected. Additionally, a case where the joining part 53 is formed by the pair of the wall sections 531 and 532 is described, but the configuration of the joining part 53 is not limited thereto and may be changed where appropriate. For example, it is also possible for the joining part 53 to be formed by the wall section 531 only or by the wall section 532 only.

Figure 3:
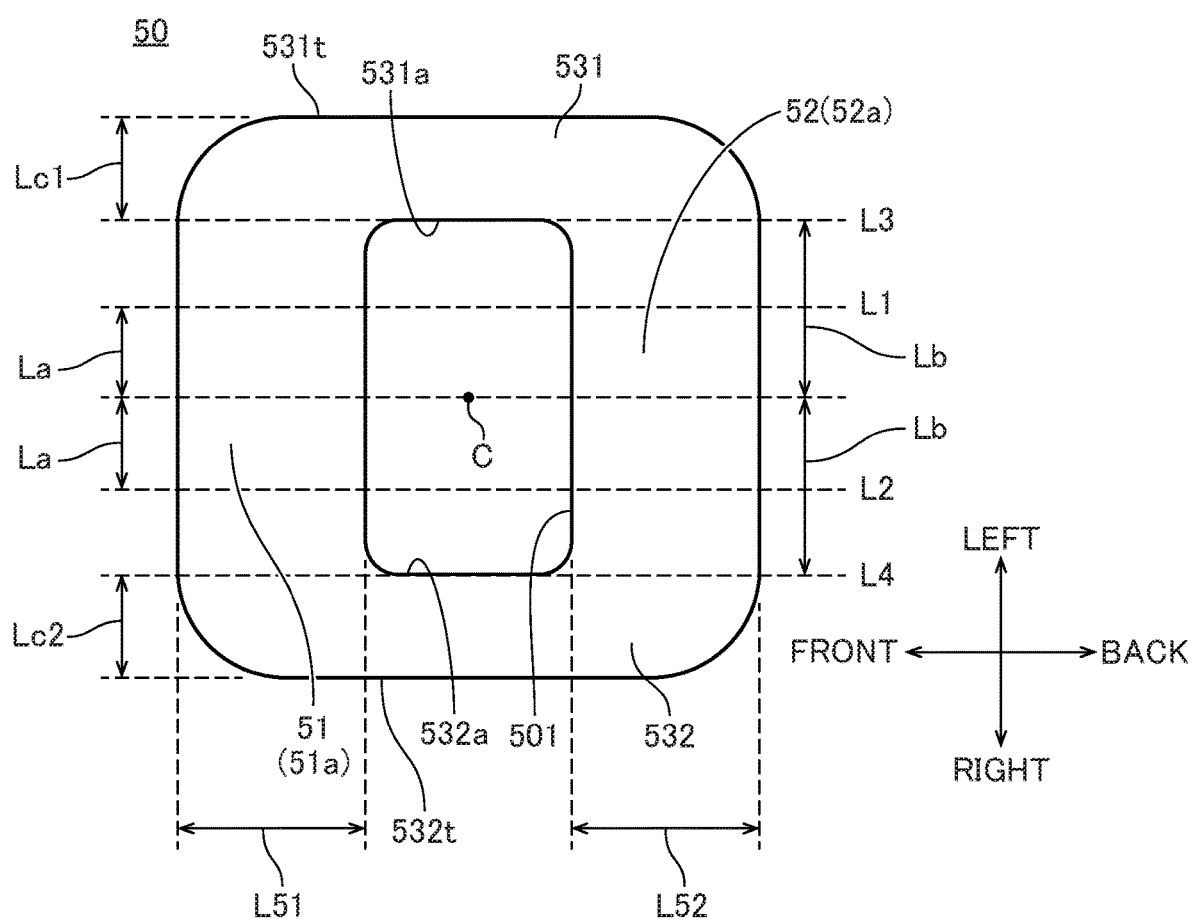
FIG. 3 is a development of the conductive member included in the semiconductor module according to the first embodiment.

Here, the configuration of the lead frame 5 according to the first embodiment will be described with reference to FIG. 3. FIG. 3 is a development of the lead frame 5 included in the semiconductor module 1 according to the first embodiment. The lead frame 5 is formed by bending (molding) a metal plate having predetermined thickness. The metal plate preferably has the same thickness dimension throughout.

As illustrated in FIG. 3, a metal plate 50 that acts as the material of the lead frame 5 is generally rectangular as seen in a plan view. The metal plate 50 is disposed with a long side in the longitudinal direction and a short side in the transverse direction. The four corners of the metal plate 50 are chamfered. A generally rectangular opening 501 is formed in the center of the metal plate 50. The opening 501 is formed so as to have a long side in the transverse direction and a short side in the longitudinal direction.

In the metal plate 50 illustrated in FIG. 3, bend lines L1 and L2 are set at positions distanced from a center C of the opening 501 by an equal length La. In other words, these bend lines L1 and L2 extend linearly in the longitudinal direction at positions distanced from the center C of the opening by the length La. On the other hand, straight lines L3 and L4 that pass through the transverse ends of the opening 501 extend linearly in the longitudinal direction at positions distanced from the center C by an equal length Lb. Here, the length Lb is longer than the length La. Consequently, the bend lines L1 and L2 are disposed at positions farther inward than the straight lines L3 and L4 that pass through the transverse ends of the opening 501.

The lead frame 5 is formed by upwardly bending the portions farther outward in the transverse direction than the bend lines L1 and L2. In other words, the lead frame 5 is formed by bending each of the portions farther outward in the transverse direction than the bend lines L1 and L2 so as to form a valley fold with respect to the portion farther inward than the bend lines L1 and L2. In the metal plate 50 illustrated in FIG. 3, the portions disposed farther outward in the transverse direction than the bend lines L1 and L2 respectively form the wall sections 531 and 532. Meanwhile, the portion disposed farther inward than the bend lines L1 and L2 forms the bonding part 51 on the front side and the bonding part 52 on the back side. Also, the portion of the opening 501 disposed farther outward (on the left side) than the bend line L1 forms the opening 531a. Similarly, the portion of the opening 501 farther on the right side than the bend line L2 forms the opening 532a.

In the semiconductor module 1 according to the first embodiment, by bonding the lead frame 5 formed in this way to the top face of the semiconductor chip 4 and the top face of the electrode pattern 2b, the semiconductor chip 4 and the electrode pattern 2b are electrically connected. In this case, the wall sections 531 and 532 forming the lead frame 5 are disposed extending in a direction substantially orthogonal to the bonding part 51 and the bonding part 52. Consequently, a portion of the lead frame 5 is not disposed between the wall section 531 and the wall section 532. In the semiconductor module 1 according to the first embodiment, the bonding wire 9 is disposed in the space between the bonding part 51 and the bonding part 52.

In the lead frame 5 according to the first embodiment, a portion of the bonding part 51 and a portion of the bonding part 52 are joined by the wall sections 531 and 532 that intersect the main surfaces 51a and 52a of the bonding part 51 and the bonding part 52. Consequently, the joining part 53 is not disposed extending substantially parallel to the bonding part 51 and the bonding part 52 at a position above the bonding part 51 and the bonding part 52. With this arrangement, the bonding wire 9 can be drawn out using the space that overlaps with the wall sections 531 and 532 forming the joining part 53 as seen in a side view. As a result, the bonding wire 9 can be disposed at a low position, and therefore a low-profile semiconductor module 1 can be attained.

The total width of the wall sections 531 and 532 is preferably equal to or greater than the width of the bonding part 51 or the width of the bonding part 52. As illustrated in FIG. 3, assuming that a length Lc1 between a top edge 531t of the wall section 531 and the opening 531a is the width of the wall section 531, and a length Lc2 between a top edge 532t of the wall section 532 is the width of the wall section 532, the sum of Lc1 and Lc2 is preferably equal to or greater than the width 2La of the bonding part 51, or equal to or greater than the width 2La of the bonding part 52. The widths Lc1 and Lc2 of the wall sections 531 and 532 may be the same or different. It is desirable for each of the wall sections 531 and 532 to have a width equal to or greater than Lc1 or Lc2 between the bonding part 51 and the bonding part 52. By configuring the wall sections 531 and 532 to have such widths, electrical resistance, heat generation, and loss in the joining part 53 can be restrained. The top edge 531t of the wall section 531 and the top edge 532t of the wall section 532 are not higher than the height of the top face of the resin case 7, preferably not higher than the height of the top face of the encapsulating resin filling the resin case 7.

Furthermore, assuming that L51 is the length of the line of intersection between the bonding part 51 and the wall sections 531 and 532, and L52 is the length of the line of intersection between the bonding part 52 and the wall sections 531 and 532, the widths Lc1 and Lc2 of the wall sections 531 and 532 are preferably equal to or greater than L51 and/or equal to or greater than L52.

Because the wall sections 531 and 532 forming the joining part 53 extend in a direction substantially orthogonal to the bonding part 51 and the bonding part 52, a portion of the lead frame 5 is not disposed between the wall sections 531 and 532 as seen in a top view (see FIG. 2). In a lead frame of the related art like the one illustrated in FIGS. 13A and 13B, it is difficult to check for foreign matter disposed underneath the joining part 913, but by configuring the joining part 53 as described above, the work of checking for foreign matter can be performed easily. Also, in a lead frame of the related art like the one illustrated in FIGS. 13A and 13B, it is difficult to fill the portion underneath the joining part 913 with encapsulating resin, but by configuring the joining part 53 as described above, the portion underneath can be filled with encapsulating resin appropriately.

An angle θ (see FIG. 1) obtained between the main surface of the bonding part 51 or 52 and the main surface on the bonding part side of the wall section 531 or 532 is 90 degrees or greater and 135 degrees or less, preferably 90 degrees or greater and 120 degrees or less, and more preferably substantially 90 degrees. Setting the angle θ to 135 degrees or less makes it possible to avoid interfering with tools when bonding the bonding wire 9 to the bonding parts 51 and 52 and also increase the widths Lc1 and Lc2 of the wall sections 531 and 532 to reduce the electrical resistance of the joining part 53. Setting the angle θ to 120 degrees or less makes it easy to fill the area surrounding the lead frame 5 with an encapsulant, and setting the angle θ substantially to 90 degrees makes it easy to inspect the portion underneath the joining part 53.

Also, the openings 531a and 532a that open downward are formed in the lower ends of the wall sections 531 and 532 forming the joining part 53. With this arrangement, the semiconductor chip 4 and the electrode pattern 2a can be electrically connected while avoiding areas where stress concentration is undesirable near the edge of the semiconductor chip 4.

Furthermore, in the lead frame 5, the wall sections 531 and 532 having the openings 531a and 532a are formed by bending the metal plate 50 that acts as the material of the lead frame 5. With this arrangement, because the joining part 53 is formed simply by bending the metal plate 50, the lead frame 5 can be fabricated without the need for complex processing steps.

In particular, the wall sections 531 and 532 are formed by bending the outer portions of the bonding part 51 and the bonding part 52 of the metal plate 50. Consequently, the positions of the bonding part 51 and the bonding part 52 do not move vertically in the process of bending. For this reason, it is easy to arrange the main surface 51a of the bonding part 51 and the main surface 52a of the bonding part 52 parallel to each other. This arrangement makes it possible to avoid a situation in which warping occurs in the insulating substrate 3 forming the semiconductor module 1 due to internal stress in the lead frame 5. In the configuration of a lead frame according to the related art like the one illustrated in FIGS. 13A and 13B, as a result of bending in the direction orthogonal to the extension direction of the lead frame, the first bonding part 911 and the second bonding part 912 may not be arranged parallel to each other in some cases. In this case, warping may occur in the insulating substrate due to internal stress in the lead frame. By bending the metal plate 50 as described above to form the lead frame 5, the occurrence of such warping can be suppressed.

Second Embodiment

Figure 4:
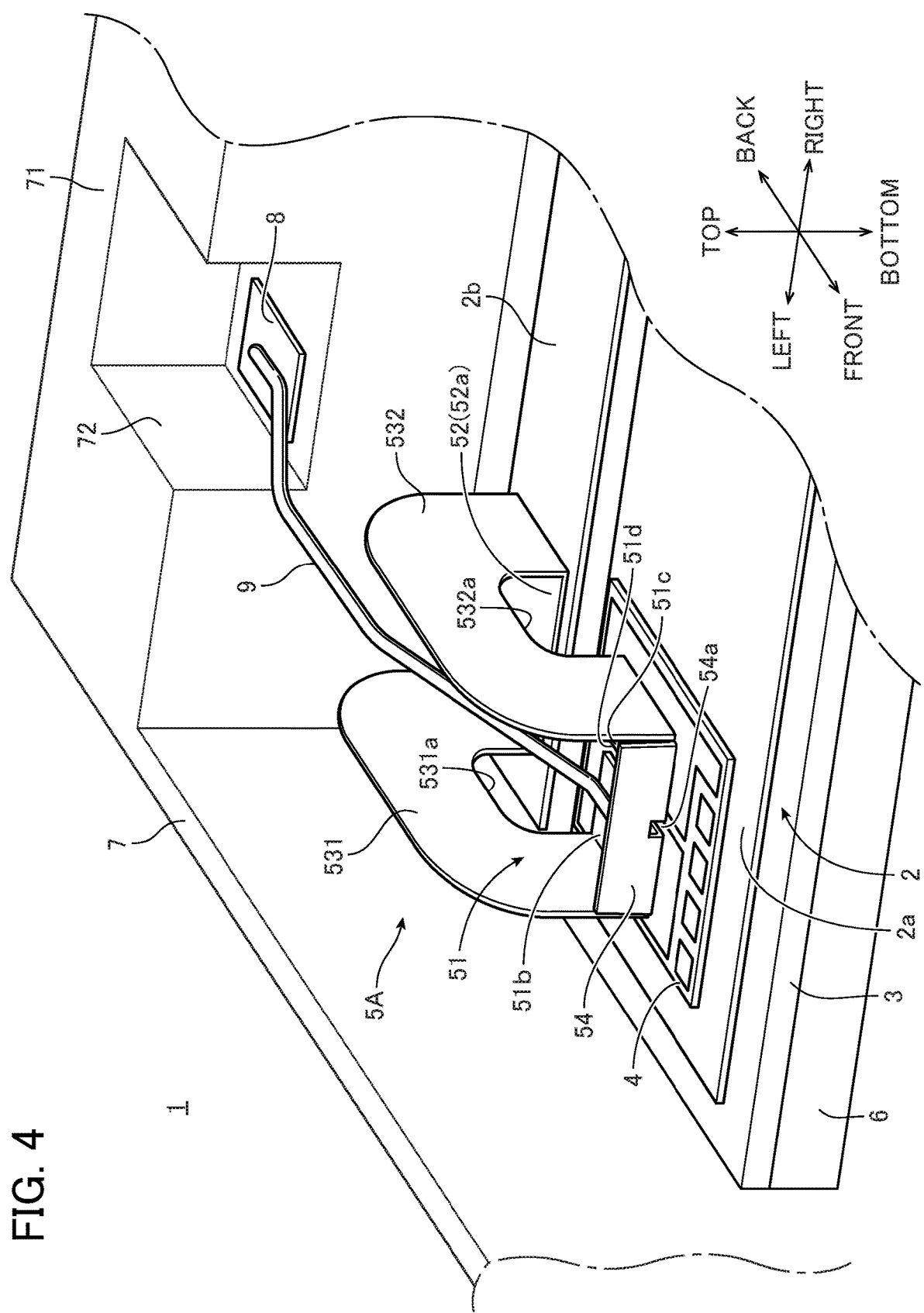
FIG. 4 is a perspective view illustrating a configuration of a semiconductor module applying a wiring structure according to a second embodiment.
Figure 5:
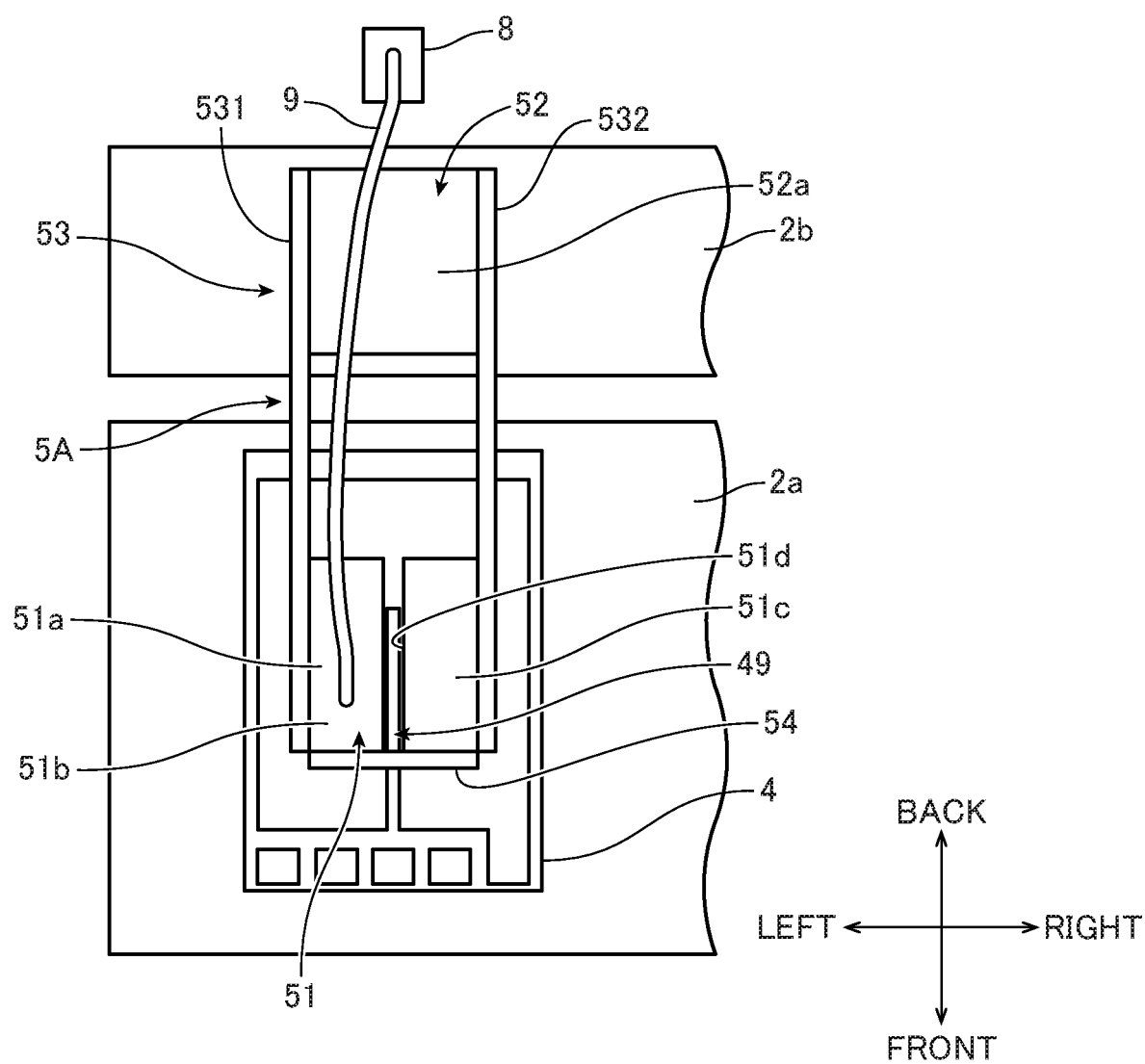
FIG. 5 is a plan view of the area surrounding a conductive member included in a semiconductor module according to the second embodiment.

A lead frame according to a second embodiment differs from the lead frame 5 according to the first embodiment in that the bonding part 51 and the surrounding configuration are different. Hereinafter, the configuration of the lead frame according to the second embodiment will be described while mainly focusing on the points that differ from the first embodiment. FIG. 4 is a perspective view illustrating a configuration of a semiconductor module 1 applying a lead frame 5A according to the second embodiment of the present invention. FIG. 5 is a plan view of the area surrounding the lead frame 5A included in the semiconductor module 1 according to the second embodiment. In FIGS. 4 and 5, portions of the configuration shared in common with FIGS. 1 and 2 are denoted with the same signs, and further description of such portions is omitted.

As illustrated in FIGS. 4 and 5, the lead frame 5A differs from the lead frame 5 according to the first embodiment in that the bonding part 51 is divided in the transverse direction, and an auxiliary joining part 54 that joins divided the bonding part 51 is included.

The bonding part 51 includes a pair of bonding sections 51b and 51c divided in the transverse direction. A slit 51d in the longitudinal direction is formed between the bonding section 51b and the bonding section 51c. The bonding part 51 is divided into the bonding section 51b and the bonding section 51c by the slit 51d. The slit 51d is formed along a portion of sensor leads 49 on the semiconductor chip 4 described later. Also, the slit 51d is disposed at a position corresponding to a temperature sensing diode 48 on the semiconductor chip 4 described later. Furthermore, the front end of the slit 51d is provided continuously with an opening 54a in the auxiliary joining part 54 described later.

The auxiliary joining part 54 is disposed on the front side of the bonding part 51 (bonding section 51b and bonding section 51c). The auxiliary joining part 54 is provided continuously with the front edge of the bonding part 51. The auxiliary joining part 54 extends upward from the front edge of the bonding part 51. The auxiliary joining part 54 joins the bonding section 51b and the bonding section 51c at a position higher than the bonding part 51. The opening 54a is formed at the lower end of the auxiliary joining part 54 near the center in the transverse direction. The opening 54a is provided continuously with the slit 51d that divides the bonding part 51.

Figure 6:
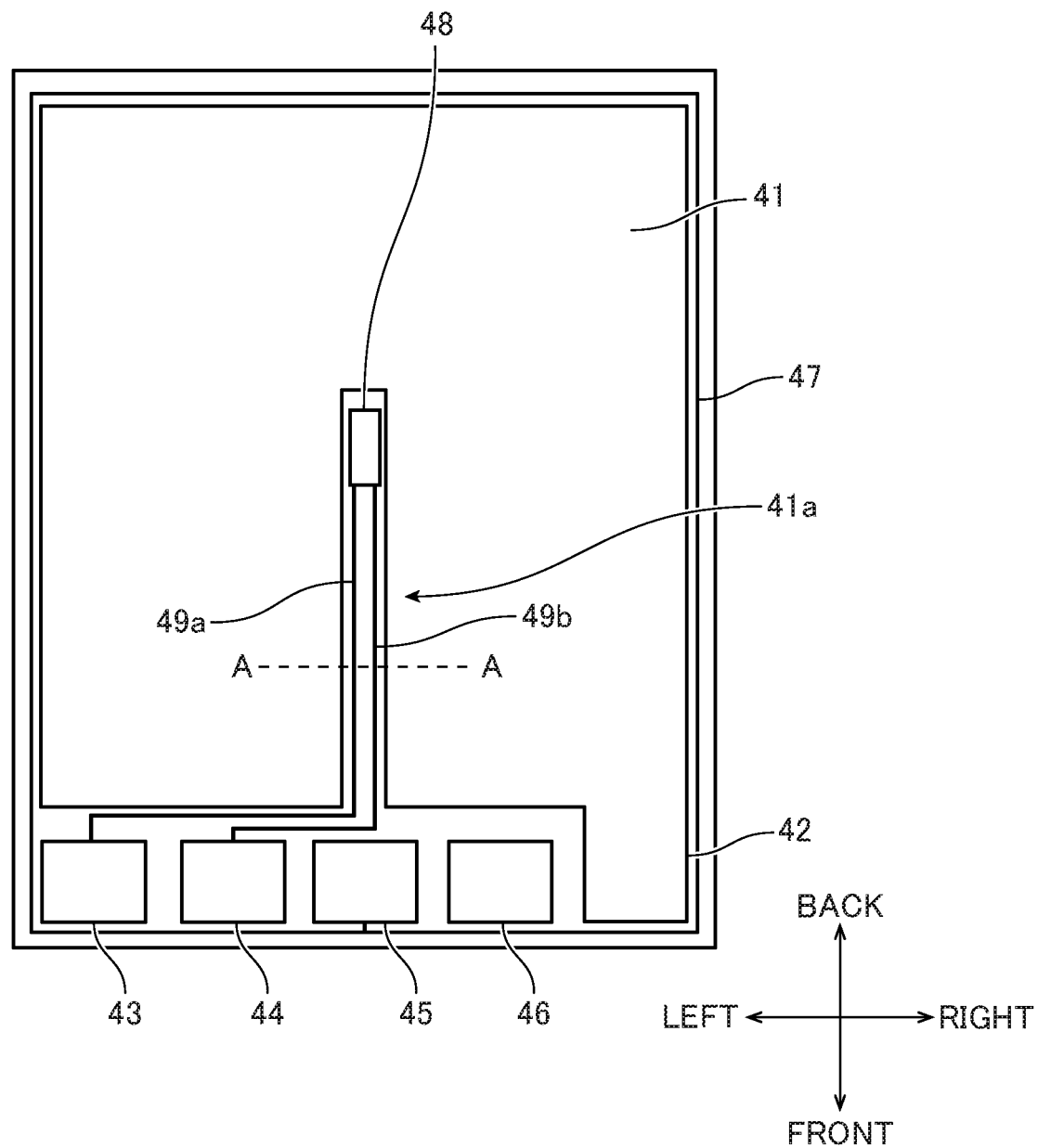
FIG. 6 is a schematic diagram illustrating a configuration of a semiconductor chip applied to the semiconductor module according to the second embodiment.

Here, the configuration of the semiconductor chip 4 applied to the semiconductor module 1 according to the second embodiment will be described with reference to FIG. 6. FIG. 6 is a schematic diagram illustrating the configuration of the semiconductor chip 4 applied to the semiconductor module 1 according to the second embodiment.

As illustrated in FIG. 6, an emitter electrode 41 is provided as a surface electrode on the top face of the semiconductor chip 4. The emitter electrode 41 occupies the majority of the top face of the semiconductor chip 4. The emitter electrode 41 may also be referred to as a source electrode. On the right edge of the emitter electrode 41, an auxiliary emitter electrode 42 is provided projecting toward the front. In front of the emitter electrode 41 and to the left of the auxiliary emitter electrode 42, an anode electrode 43, a cathode electrode 44, a gate electrode 45, and a current sensing electrode 46 are provided side by side.

A gate runner 47 is provided near the perimeter of the top face of the semiconductor chip 4. The gate runner 47 is an example of a gate lead. The gate runner forms a ring surrounding the emitter electrode 41, the auxiliary emitter electrode 42, the anode electrode 43, the cathode electrode 44, the gate electrode 45, and the current sensing electrode 46. The gate runner 47 is connected to the gate electrode 45 at the front end of the semiconductor chip 4.

In the center of the emitter electrode 41 in the transverse direction, a notch 41a is formed from the front end going toward the back. The notch 41a ends near the center in the longitudinal direction of the emitter electrode 41. The temperature sensing diode 48 is provided near the back end of the notch 41a. The temperature sensing diode 48 is an example of a temperature sensor, and detects the temperature of the semiconductor chip 4. A pair of sensor leads 49 (49a and 49b) are connected to the temperature sensing diode 48. The sensor leads 49a and 49b run along the notch 41a and are connected to the anode electrode 43 and the cathode electrode 44, respectively. Although the case where the pair of sensor leads 49 (49a and 49b) are disposed in the notch 41a is described here, the configuration is not limited thereto. For example, the gate runner 47 may also be disposed in the notch 41a.

Figure 7:
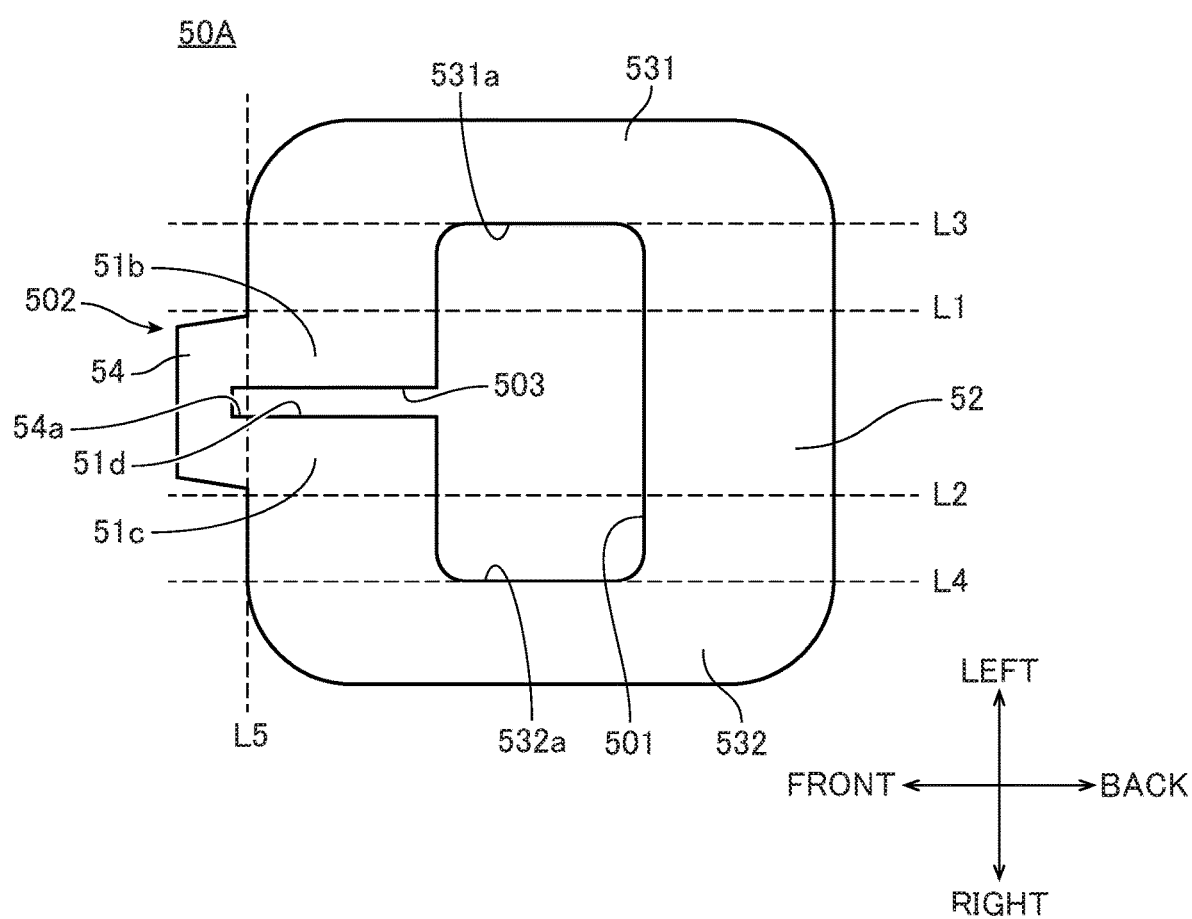
FIG. 7 is a development of the conductive member included in the semiconductor module according to the second embodiment.

Here, the configuration of the lead frame 5A according to the second embodiment will be described with reference to FIG. 7. FIG. 7 is a development of the lead frame 5A included in the semiconductor module 1 according to the second embodiment. In FIG. 7, portions of the configuration shared in common with FIG. 3 are denoted with the same signs, and further description of such portions is omitted. The lead frame 5A is formed by bending (molding) a metal plate having a constant thickness dimension throughout.

As illustrated in FIG. 7, a metal plate 50A that acts as the material of the lead frame 5A differs from the metal plate 50 according to the first embodiment in that a projection 502 that projects toward the front is provided in the middle of the transverse direction, and a notch 503 is formed on the front side of the opening 501. The projection 502 is provided projecting to the front past a bend line L5 disposed along the perimeter on the front side of the metal plate 50A. The notch 503 is formed extending in the longitudinal direction from the opening 501 to a position in the projection 502, the position being farther to the front than the bend line L5.

The lead frame 5A is formed by upwardly bending the portions farther outward in the transverse direction than the bend lines L1 and L2, and also upwardly bending the portion farther to the front than the bend line L5. In other words, the lead frame 5A is formed by bending the portions farther outward in the transverse direction than the bend lines L1 and L2 so as to form a valley fold with respect to the portion farther inward than the bend lines L1 and L2, and also bending the portion farther to the front than the bend line L5 so as to form a valley fold with respect to the portion farther to the back than the bend line L5. In the metal plate 50A illustrated in FIG. 7, the projection 502 forms the auxiliary joining part 54. Also, the portion of the notch 503 that is disposed behind the bend line L5 forms the slit 51*d*. Meanwhile, the portion of the notch 503 that is disposed in front of the bend line L5 forms the opening 54*a* in the auxiliary joining part 54.

In the semiconductor module 1 according to the second embodiment, by bonding the lead frame 5A formed in this way to the top face of the semiconductor chip 4 and the top face of the electrode pattern 2*b*, the semiconductor chip 4 and the electrode pattern 2*b* are electrically connected. In this case, the bonding part 51 forming the lead frame 5A is disposed such that the slit 51*d* is disposed in correspondence with the sensor leads 49 of the semiconductor chip 4, as illustrated in FIG. 5. Consequently, a portion of the lead frame 5A (bonding part 51) is not disposed above the sensor leads 49. This arrangement makes it possible to prevent a situation in which the semiconductor chip 4 is damaged due to the placement of the lead frame 5A above the sensor leads 49.

Figure 8A:
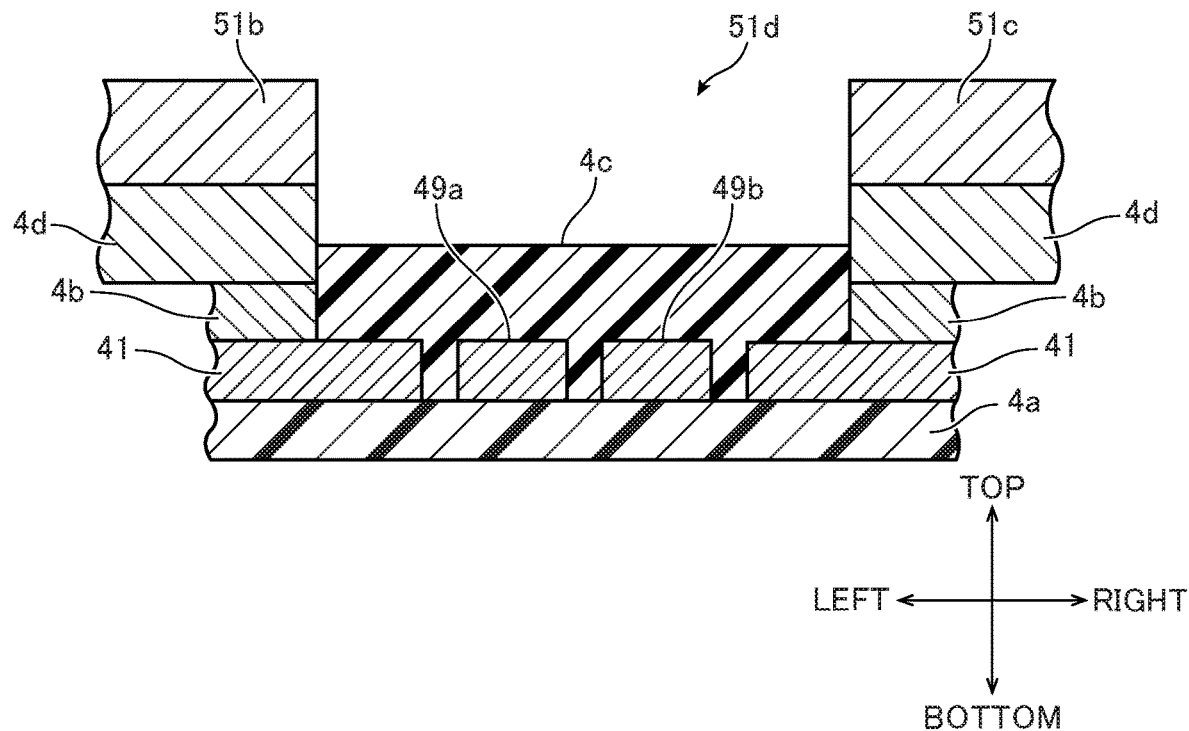
FIGS. 8A and 8B are schematic diagrams illustrating a configuration surrounding sensor wiring provided on the semiconductor chip according to the second embodiment.
Figure 8B:
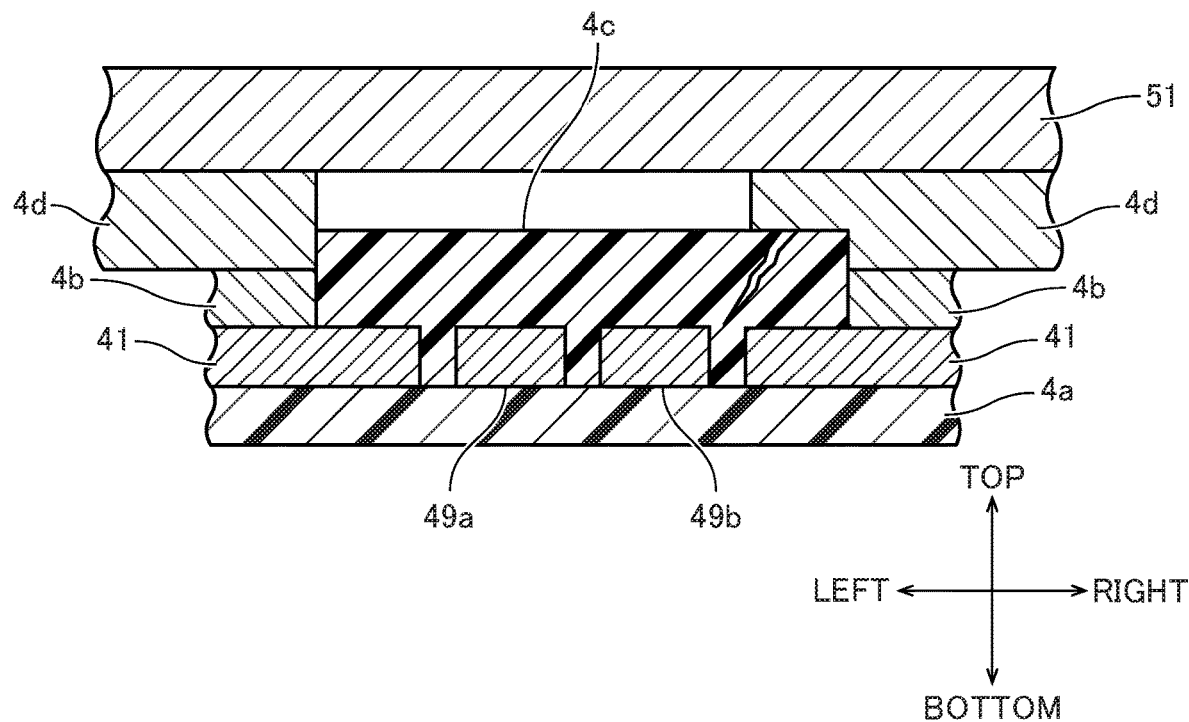

Here, the configuration surrounding the sensor leads 49 in the semiconductor chip 4 will be described with reference to FIGS. 8A and 8B. FIGS. 8A and 8B are schematic diagrams illustrating the configuration surrounding the sensor leads 49 provided on the semiconductor chip 4. FIG. 8A illustrates a cross-section view along the dashed line A-A illustrated in FIG. 6. As a reference example, FIG. 8B illustrates the configuration surrounding the sensor leads 49 of the semiconductor chip 4 in the case where a bonding part 51 without the slit 51*d* is bonded. Note that in FIG. 8B, the signs used in the second embodiment are applied for convenience.

As illustrated in FIG. 8A, in the semiconductor chip 4, the emitter electrode 41 and the sensor leads 49*a* and 49*b* are provided on top of an interlayer insulating film 4*a* forming the semiconductor chip 4. A plated electrode 4*b* is provided on the emitter electrode 41. On top of the sensor leads 49*a* and 49*b*, a polyimide 4*c* for securing insulation between the sensor leads 49*a* and 49*b* is provided. The slit 51*d* formed in the bonding part 51 is disposed above the polyimide 4*c*.

The bonding section 51*b* forming the bonding part 51 is bonded by solder 4*d* to the plated electrode 4*b* disposed on the left side of the polyimide 4*c*. Similarly, the bonding section 51*c* forming the bonding part 51 is bonded by the solder 4*d* to the plated electrode 4*b* disposed on the right side of the polyimide 4*c*. Consequently, when bonding the bonding sections 51*b* and 51*c* to the semiconductor chip 4, the solder 4*d* is not pressed against the polyimide 4*c*.

On the other hand, as illustrated in FIG. 8B, in the case where the slit 51*d* is not formed in the bonding part 51, the bonding part 51 is bonded to the plated electrode 4*b* by the solder 4*d* disposed at positions corresponding to the plated electrode 4*b*. In this case, if some of the solder 4*d* is disposed on top of the polyimide 4*c*, a portion of the solder 4*d* is pressed against the polyimide 4*c* by the portion of the bonding part 51 disposed above the polyimide 4*c*. In this case, if there is a crack in the polyimide 4*c* for example, the solder 4*d* will infiltrate the polyimide 4*c* and contact the sensor leads 49. As a result, the lead frame 5A and the sensor leads 49 will become electrically connected, and a situation in which the semiconductor chip 4 is damaged may occur. In the lead frame 5A according to the second embodiment, providing the slit 51*d* in the bonding part 51 prevents such damage to the semiconductor chip 4.

In the lead frame 5A according to the second embodiment, because the slit 51*d* is provided at a position corresponding to the sensor leads 49 provided on the semiconductor chip 4, it is possible to avoid a situation in which the semiconductor chip 4 is damaged due to the pressing force associated with bonding when the lead frame 5A is bonded to the semiconductor chip 4. Particularly, in the lead frame 5A, because the slit 51*d* can be formed simply by bending the metal plate 50A in which the notch 503 has been formed, the lead frame 5A capable of preventing damage to the semiconductor chip 4 can be formed without the need for complex processing steps.

Also, the lead frame 5A according to the second embodiment is provided with the auxiliary joining part 54 that joins the bonding section 51*b* to the bonding section 51*c* divided by the slit 51*d*. With this arrangement, the bonding section 51*b* and the bonding section 51*c* can be handled as a single member even in the case where the slit 51*d* is provided, thereby making it easier for current to flow through the lead frame 5A and also improving the work efficiency when assembling the semiconductor module 1. Particularly, in the lead frame 5A, because the auxiliary joining part 54 can be formed simply by bending the metal plate 50A in which the projection 502 has been formed, the lead frame 5A having excellent conductivity and workability can be formed without the need for complex processing steps.

Furthermore, in the lead frame 5A according to the second embodiment, because the slit 51*d* is provided in the bonding part 51 at a position corresponding to the temperature sensing diode 48 provided on the semiconductor chip 4, it is possible to keep the temperature sensing diode 48 from being blocked by the underside of the bonding part 51 when bonding the lead frame 5A. With this arrangement, the temperature of the semiconductor chip 4 can be detected in an exposed state on the top side of the bonding part 51, and therefore the accuracy of the detection by the temperature sensing diode 48 can be improved.

Third Embodiment

Figure 9:
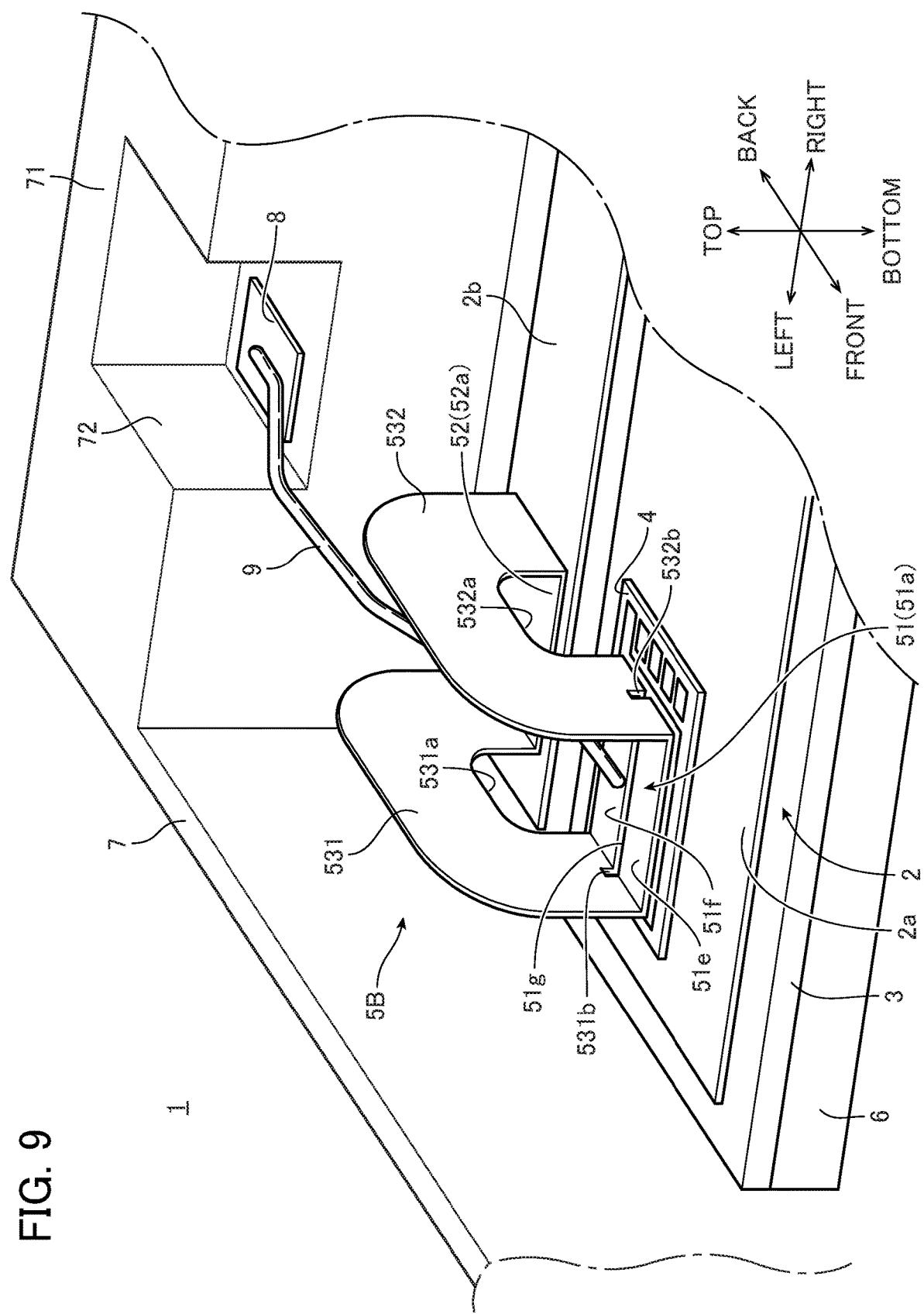
FIG. 9 is a perspective view illustrating a configuration of a semiconductor module applying a wiring structure according to a third embodiment.
Figure 10:
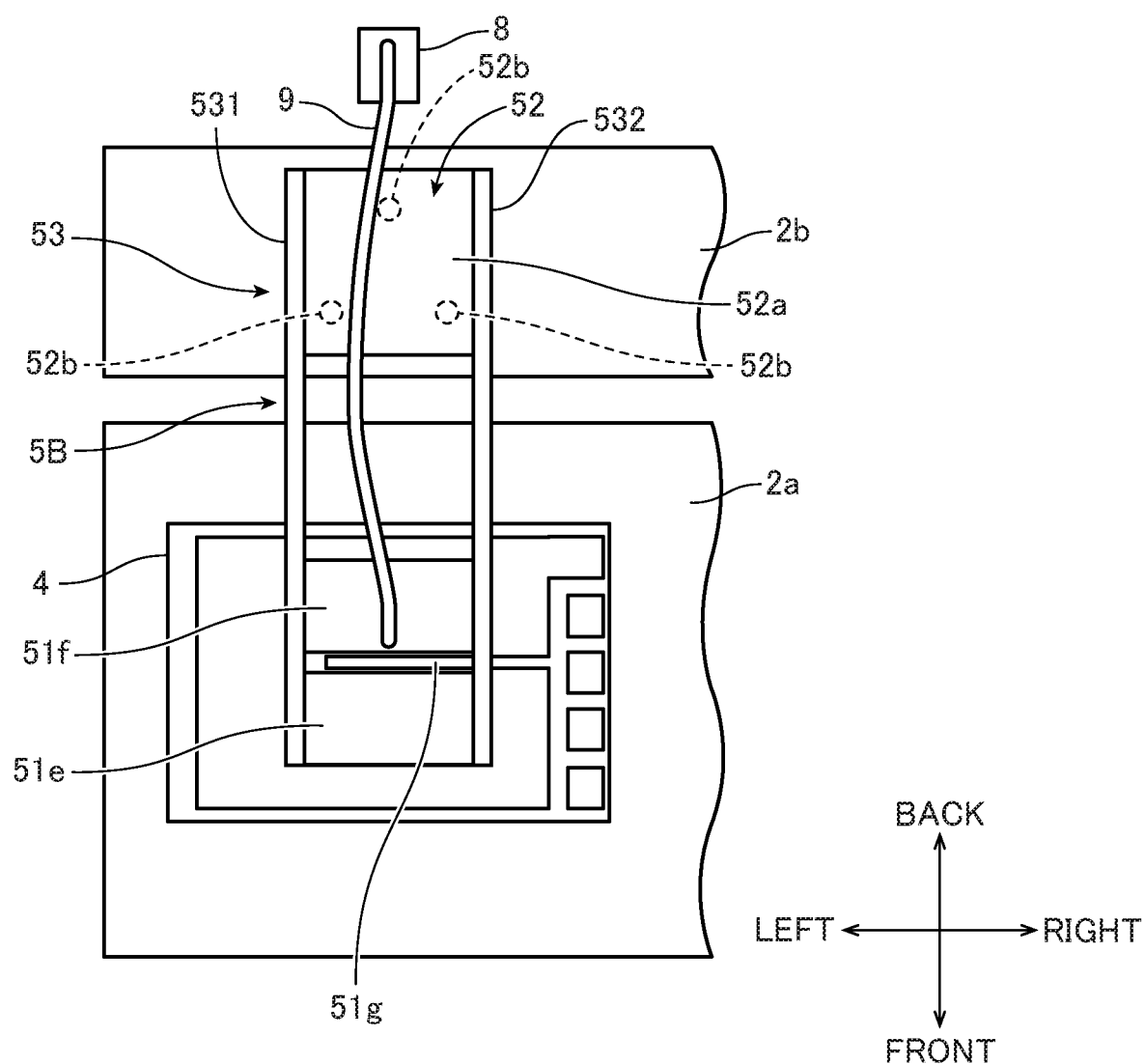
FIG. 10 is a plan view of the area surrounding a conductive member included in a semiconductor module according to a third embodiment.

A lead frame according to a third embodiment differs from the lead frame 5A according to the second embodiment in that the configuration of the bonding part 51 is different. Hereinafter, the configuration of the lead frame according to the third embodiment will be described while mainly focusing on the points that differ from the second embodiment. FIG. 9 is a perspective view illustrating a configuration of a semiconductor module 1 applying a lead frame 5B according to the third embodiment of the present invention. FIG. 10 is a plan view of the area surrounding the lead frame 5B included in the semiconductor module 1 according to the third embodiment. In FIGS. 9 and 10, portions of the configuration shared in common with FIGS. 4 and 5 are denoted with the same signs, and further description of such portions is omitted.

As illustrated in FIGS. 9 and 10, the lead frame 5B differs from the lead frame 5A according to the second embodiment in that the bonding part 51 is divided in the longitudinal direction. Note that the lead frame 5B is not provided with the auxiliary joining part 54.

The bonding part 51 includes a pair of bonding sections 51e and 51f divided in the longitudinal direction. A slit 51g in the transverse direction is formed between the bonding section 51e and the bonding section 51f. The bonding part 51 is divided into the bonding section 51e and the bonding section 51f by the slit 51g. Like the slit 51d according to the second embodiment, the slit 51g is formed along a portion of the sensor leads 49 on the semiconductor chip 4, and is disposed at a position corresponding to the temperature sensing diode 48 on the semiconductor chip 4. Furthermore, the left end of the slit 51g is provided continuously with an opening 531b formed in the lower end of the wall section 531. Similarly, the right end of the slit 51g is provided continuously with an opening 532b formed in the lower end of the wall section 532.

As illustrated in FIG. 10, the semiconductor chip 4 to which the lead frame 5B is bonded differs from the semiconductor module 1 according to the second embodiment by being rotated 90 degrees as seen in a plan view. The configuration of the semiconductor chip 4 is the same as the semiconductor chip 4 according to the second embodiment.

Figure 11:
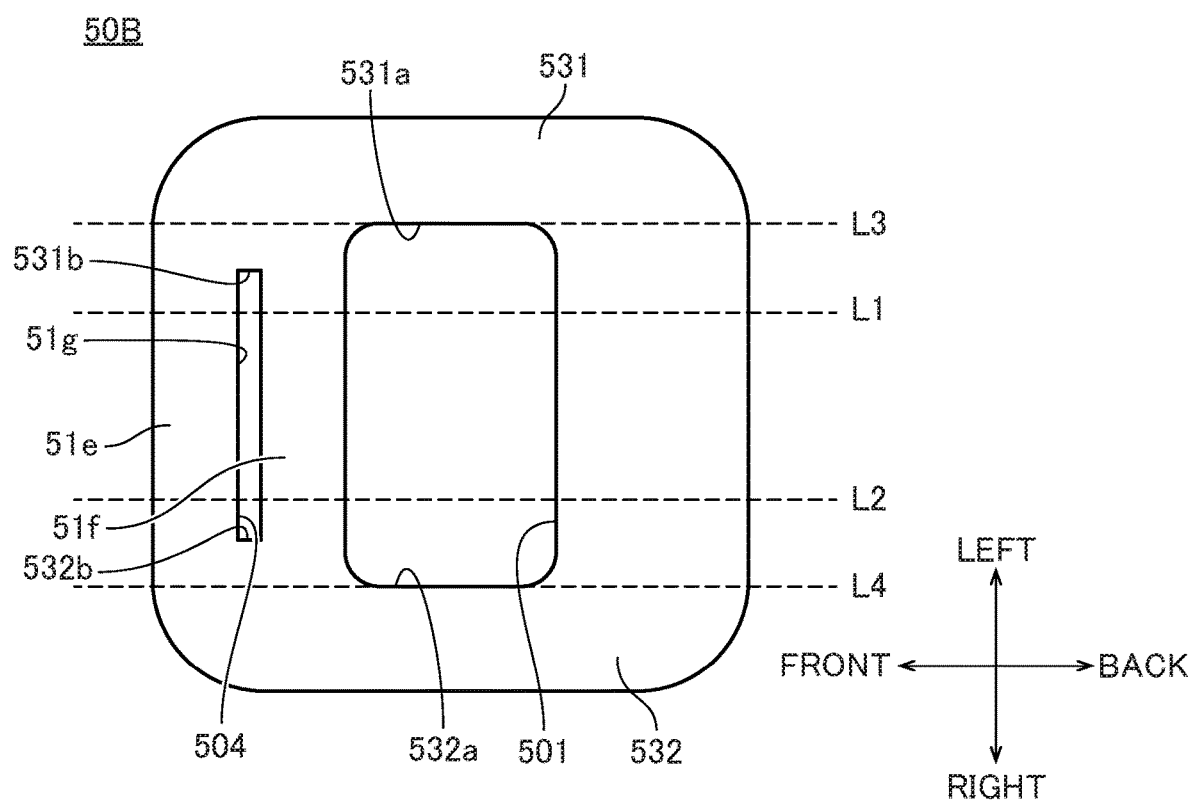
FIG. 11 is a development of the conductive member included in the semiconductor module according to the third embodiment.

Here, the configuration of the lead frame 5B according to the third embodiment will be described with reference to FIG. 11. FIG. 11 is a development of the lead frame 5B included in the semiconductor module 1 according to the third embodiment. In FIG. 11, portions of the configuration shared in common with FIG. 7 are denoted with the same signs, and further description of such portions is omitted. The lead frame 5B is formed by bending (molding) a metal plate having a constant thickness dimension throughout.

As illustrated in FIG. 11, a metal plate 50B that acts as the material of the lead frame 5B differs from the metal plate 50A according to the second embodiment in that a notch 504 is formed on the front side of the opening 501, and the projection 502 is not provided. The notch 504 is formed in the transverse direction. The left end of the notch 504 is disposed at a position farther to the left than the bend line L1, and the right end of the notch 504 is disposed at a position farther to the right than the bend line L2.

The lead frame 5B is formed by upwardly bending the portions farther outward in the transverse direction than the bend lines L1 and L2. In the metal plate 50B illustrated in FIG. 11, the notch 504 forms the slit 51g of the bonding part 51. Also, the portion disposed farther to the front than the notch 504 and between the bend line L1 and the bend line L2 forms the bonding section 51e. Meanwhile, the portion disposed farther to the back than the notch 504 and between the bend line L1 and the bend line L2 forms the bonding section 51f. The portion of the notch 504 disposed farther to the left than the bend line L1 forms the opening 531b. Also, the portion of the notch 504 disposed farther to the right than the bend line L2 forms the opening 532b.

In the semiconductor module 1 according to the third embodiment, by bonding the lead frame 5B formed in this way to the top face of the semiconductor chip 4 and the top face of the electrode pattern 2b, the semiconductor chip 4 and the electrode pattern 2b are electrically connected. In this case, the bonding part 51 forming the lead frame 5B is disposed such that the slit 51g is disposed in correspondence with the sensor leads 49 of the semiconductor chip 4, as illustrated in FIG. 10. Consequently, a portion of the lead frame 5B (bonding part 51) is not disposed above the sensor leads 49. Like the second embodiment, this arrangement makes it possible to prevent a situation in which the semiconductor chip 4 is damaged due to the placement of the lead frame 5B above the sensor leads 49.

(Modifications)

Figure 12A:
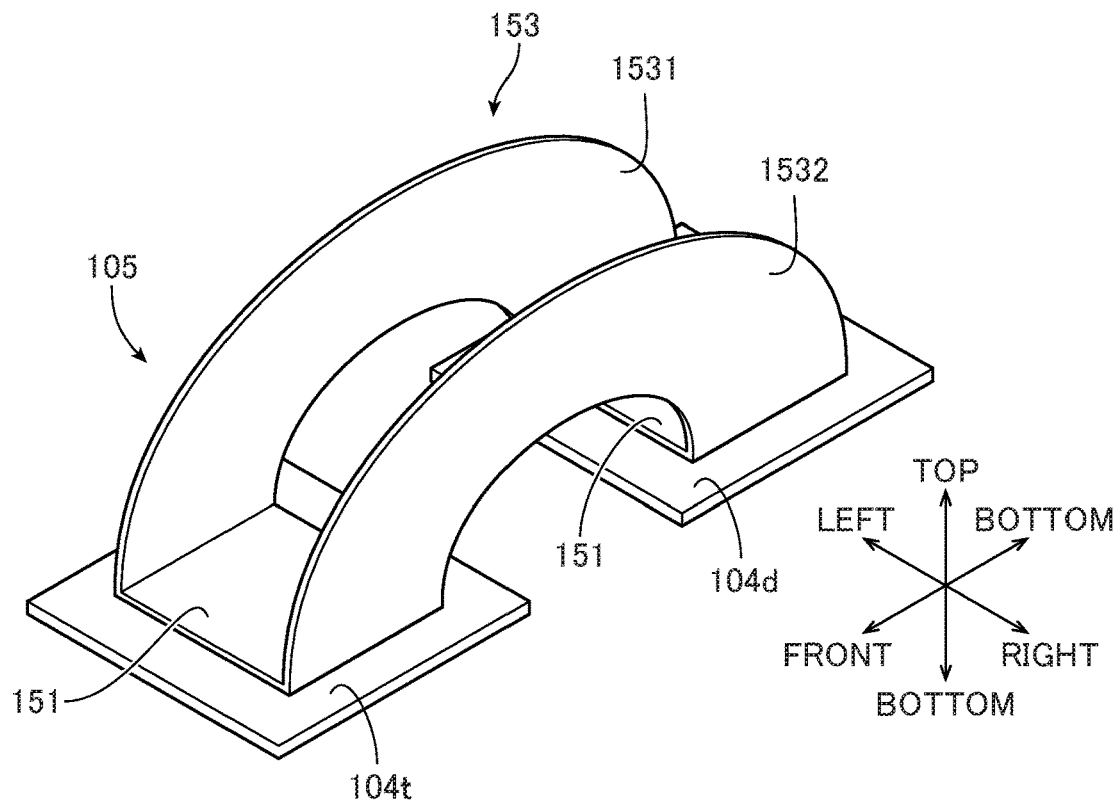
FIGS. 12A and 12B are schematic diagrams of a wiring structure according to a modification of the present invention.
Figure 12B:
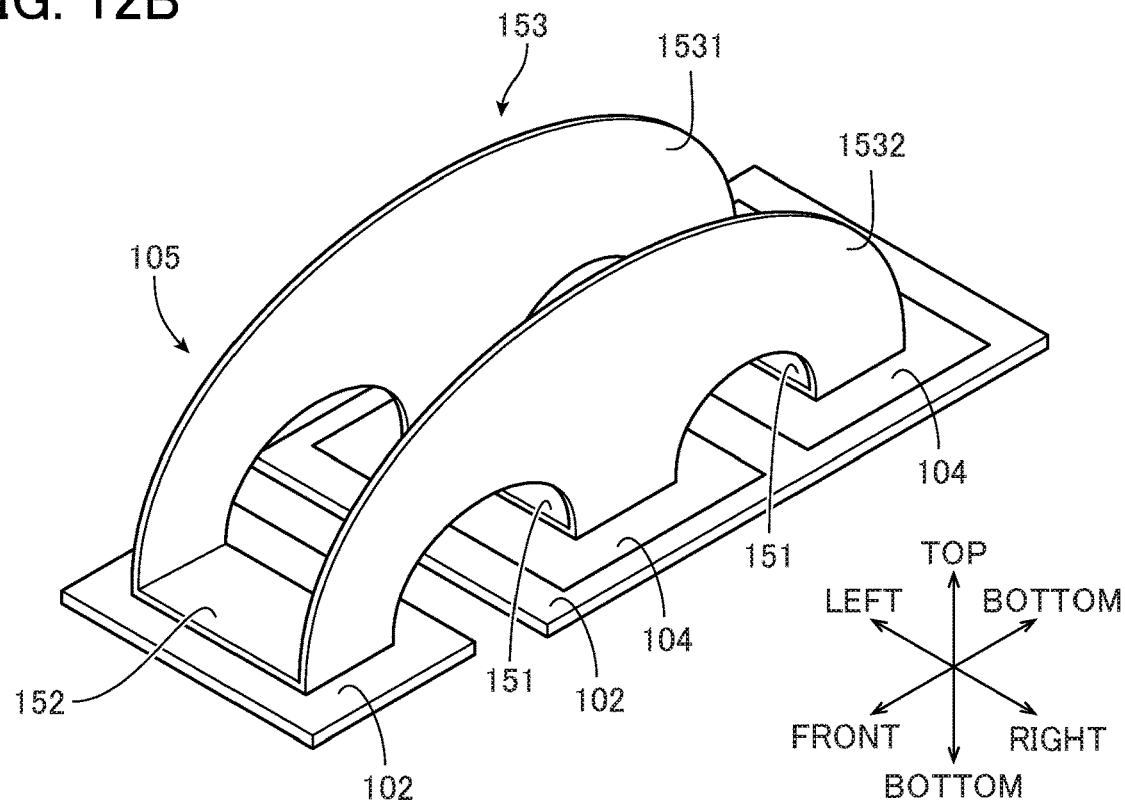

FIGS. 12A and 12B illustrate modifications of the wiring structure.

In the example of FIG. 12A, a lead frame 105 has a shape similar to the lead frame 5 according to the first embodiment and electrically connects a semiconductor chip 104t containing a switching element to a semiconductor chip 104d containing a diode. The lead frame 105 includes a pair of bonding parts 151 and 151, and a pair of wall sections 1531 and 1532 standing upright on the bonding parts 151 and 151. One bonding part 151 is bonded to a top electrode of the semiconductor chip 104t, while the other bonding part 151 is bonded to a top electrode of the semiconductor chip 104d.

In the example of FIG. 12B, the lead frame 105 electrically connects two semiconductor chips 104 provided on one electrode pattern 102 to the other electrode pattern 102. The two semiconductor chips 104 are connected in parallel by the lead frame 105 and the one electrode pattern 102. The lead frame 105 includes a pair of bonding parts 151 and 151, a bonding part 152, and a pair of wall sections 1531 and 1532 standing upright on the bonding parts 151, 151, and 152. The wall sections 1531 and 1532 each have two openings in the lower side thereof. The bonding parts 151 and 151 are bonded to top electrodes of the semiconductor chips 104 and 104, and the bonding part 152 is bonded to the other electrode pattern 102.

Note that the present invention is not limited to the embodiments described above, and various modifications are possible. In the embodiments described above properties such as the sizes, shapes, and functions of the components illustrated in the accompanying drawings are not limited to what is illustrated, and such properties may be modified appropriately insofar as the effects of the present invention are still achieved. Otherwise, other appropriate modifications are possible without departing from the scope of the present invention.

For example, the above embodiments describe a case in which the bonding part 51 and the bonding part 52 of the lead frame 5 (5A, 5B) are bonded to the semiconductor chip 4 and the electrode pattern 2b arranged in the same plane. However, the configuration of the lead frame 5 is not limited thereto and may be modified appropriately. For example, to achieve bonding with bonding targets disposed on surfaces at uneven heights, it is preferable to configure an embodiment in which a protruding part for height adjustment is provided in a portion of the bottom face of the bonding part 51 or the bonding part 52. Such a protruding part may be configured as protrusions 52b arranged equidistantly on the bottom face of the bonding part 52 that project toward the electrode pattern 2b, for example (see FIG. 10). By providing a protruding part for height adjustment in a portion of the bottom face of the bonding part 51 or the bonding part 52, the bonding part 51 and the bonding part 52 can be bonded suitably to the semiconductor chip 4 and the electrode pattern 2b, even in the case where the semiconductor chip 4 and the electrode pattern 2b are positioned at uneven heights.

Also, the above embodiments describe a case where the wall sections 531 and 532 that form the joining part 53 of the lead frame 5 join the edges (left edges and right edges) of the bonding parts 51 and 52. However, the positions joined by the wall sections 531 and 532 are not limited to the above and may be changed appropriately. For example, the wall section 532 may also join a position farther inward than the right edge of the main surface 51a of the bonding part 51 to a position farther inward than the right edge of the main surface 52a of the bonding part 52. Note that in this case, unlike the embodiments described above, it is necessary to perform a bonding process by welding or the like on the top faces of the bonding parts 51 and 52.

Features of the above embodiments are summarized below.

A wiring structure according to the embodiments described above is a wiring structure that electrically connects a semiconductor chip and a connection target of the semiconductor chip, and includes a first bonding part that is disposed on one side of a conductive member and bonded to the semiconductor chip, a second bonding part that is disposed on another side of the conductive member and bonded to the connection target, and a joining part that joins the first bonding part and the second bonding part. The joining part has wall sections intersecting the main surfaces of the first bonding part and the second bonding part, and the wall sections join a portion of the first bonding part to a portion of the second bonding part. According to this configuration, because a portion of the first bonding part and a portion of the second bonding part are joined by wall sections intersecting the main surfaces of the first bonding part and the second bonding part, the joining part is not disposed so as to extend substantially parallel to the first bonding part and the second bonding part at a position above the first bonding part and the second bonding part. Consequently, a bonding wire can be drawn out using a space that overlaps with the wall sections forming the joining part as seen in a side view. As a result, the bonding wire can be disposed at a low position, and therefore a low-profile semiconductor module can be attained.

In the wiring structure according to the embodiments described above, openings that open toward the first bonding part and the second bonding part are formed between the first bonding part and the second bonding part in lower ends of the wall sections. According to this configuration, because the openings are formed in the lower ends of the wall sections, the semiconductor chip and the connection target can be electrically connected while avoiding areas where stress concentration is undesirable in the semiconductor chip and the connection target.

In the wiring structure according to the embodiments described above, the wall sections having the openings are formed by bending a metal plate that acts as the material of the conductive member that includes the first bonding part and the second bonding part. According to this configuration, because the wall sections having the openings are formed simply by bending the metal plate that acts as the material of the conductive member, the conductive member can be fabricated without the need for complex processing steps.

In the wiring structure according to the embodiments described above, the first bonding part has a slit at a position corresponding to at least one of a temperature sensor, a sensor lead, and a gate lead provided on the semiconductor chip. According to this configuration, because the slit is provided at a position corresponding to at least one of a temperature sensor, a sensor lead, and a gate lead provided on the semiconductor chip, in the case of the gate lead or the sensor lead, a situation in which semiconductor elements are damaged due to the arrangement of the conductive member above the gate lead or the sensor lead can be prevented. In the case of the temperature sensor, it is possible to keep the temperature sensor from being blocked by the underside of the first bonding part, thereby making it possible for the temperature sensor to detect the temperature of the semiconductor chip in an exposed state on the top side of the first bonding part, and the accuracy of the detection by the temperature sensor can be improved.

The wiring structure according to the embodiments described above includes an auxiliary joining part that joins portions of the first bonding part divided by the slit to each other. According to this configuration, because the portions of the first bonding part divided by the slit are joined to each other by the auxiliary joining part, the first bonding part and the second bonding part can be handled as a single member even in the case where the slit is provided, thereby making it easier for current to flow through the conductive member and also improving the work efficiency when assembling the semiconductor module.

The wiring structure according to the embodiments described above includes a protruding part for height adjustment on a bottom face of at least one of the first bonding part and the second bonding part. According to this configuration, because the protruding part for height adjustment is provided on the bottom face of at least one of the first bonding part and the second bonding part, the first bonding part and the second bonding part can be bonded suitably to the semiconductor chip and the connection target, even in the case where the semiconductor chip and the connection target are positioned at uneven heights.

In the wiring structure according to the embodiments described above, the width of the wall sections is equal to or greater than the width of the first bonding part or the width of the second bonding part. According to this configuration, because the width of the wall sections is configured to be equal to or greater than the width of the first bonding part or the width of the second bonding part, electrical resistance, heat generation, and loss in the wall sections can be restrained.

In the wiring structure according to the embodiments described above, the width of the wall sections is equal to or greater than the length of the line of intersection between the first bonding part and the wall sections or the length of the line of intersection between the second bonding part and the wall sections. According to this configuration, because the width of the wall sections is configured to be equal to or greater than the length of the line of intersection between the first bonding part and the wall sections or the length of the line of intersection between the second bonding part and the wall sections, electrical resistance, heat generation, and loss in the wall sections can be restrained.

A semiconductor module according to the embodiments described above includes any of the wiring structures described above. According to this configuration, the effects obtained by the wiring structures described above can be obtained by the semiconductor module.

INDUSTRIAL APPLICABILITY

A semiconductor module according to the present invention has an effect of enabling a low-profile semiconductor module to be attained, and is favorable as a semiconductor module demanded to be more compact and lightweight and also to have better long-term reliability in high-temperature operating environments, such as a vehicle motor driving control inverter.

REFERENCE SIGNS LIST 1 semiconductor module
2, 2a, 2b electrode pattern
3 insulating substrate
4 semiconductor chip
5, 5A, 5B lead frame
6 metal substrate
7 resin case
8 metal terminal
9 bonding wire
41 emitter electrode
41a notch
42 auxiliary emitter electrode
43 anode electrode
44 cathode electrode
45 gate electrode
46 current sensing electrode
47 gate runner
48 temperature sensing diode
49, 49a, 49b sensor lead
50, 50A, 50B metal plate
51 bonding part
51a main surface
51b, 51c bonding section
51d slit
51e, 51f bonding section
51g slit
52 bonding part
52a main surface
52b protrusion
53 joining part
531 wall section
531a, 531b opening
532 wall section
532a, 532b opening
54 auxiliary joining part
54a opening

What is claimed is:

1. A wiring structure, comprising:
a conductive member for electrically connecting a semiconductor chip to a connection target, wherein
the conductive member has one side and another side opposite to each other in a first direction, and includes
a first bonding part having a main surface that is flat and has two opposing sides extending in the first direction, the first bonding part being disposed at the one side of the conductive member and to be bonded to the semiconductor chip,
a second bonding part having a main surface that is flat and has two opposing sides extending in the first direction, the second bonding part being disposed at the other side of the conductive member spaced from the first bonding part in the first direction and to be bonded to the connection target, the main surface of the second bonding part extending continuously between the two opposing sides thereof in a second direction orthogonal to the first direction and parallel to the main surfaces of the first and second bonding parts, and
first and second joining parts respectively having first and second wall sections, the first joining part being directly connected to respective ones of the two opposing sides of the first and second bonding parts and extending in a third direction away from the main surfaces of the first and second bonding parts, the second joining part being directly connected to respective other ones of the two opposing sides of the first and second bonding parts and extending in a fourth direction away from the main surfaces of the first and second bonding parts, the first joining part having a flat surface parallel to a plane defined by the first and third directions, the second joining part having a flat surface parallel to a plane defined by the first and fourth directions, the flat surface of the first joining part and the flat surface of the second joining part facing each other, the flat surface of the first joining part and the flat surface of the second joining part being separated by a space that continuously extends in the first direction between the first bonding part and the second bonding part so as to overlap with the first and second wall sections as seen in a side view of the wiring structure;
wherein an angle between the main surface of the first bonding part and the flat surface parallel to a plane defined by the first and third directions or an angle between the main surface of the second bonding part and the flat surface parallel to a plane defined by the first and third directions is in a range of 90 degrees to 135 degrees, and
wherein an angle between the main surface of the first bonding part the flat surface parallel to a plane defined by the first and fourth directions or an angle between the main surface of the second bonding part and the flat surface parallel to a plane defined by the first and fourth is in a range of 90 degrees to 135 degrees.

2. The wiring structure according to claim 1, wherein
each of the first and second wall sections has first and second lower ends which are respectively connected to one of the two opposing sides of the first bonding part and one of the two opposing sides of the second bonding part, and
each of the first and second wall sections has an opening that is located between the first and second lower ends thereof.

3. The wiring structure according to claim 2, wherein
the conductive member is made of a metal plate having another opening located around a center thereof,
portions of the metal plate that are respectively at one side and another side of the metal plate opposite to each other in the first direction respectively constitute the first bonding part and the second bonding part, and
first and second bent portions of the metal plate, which are portions of the metal plate other than the first and second bonding parts and are respectively bent in the third direction and the fourth direction, respectively constitute the first and second joining parts, and portions of the other opening respectively constitute the opening of each of the first and second wall sections.

4. The wiring structure according to claim 1, further comprising:
a protruding part for adjusting a position of at least one of the first bonding part and the second bonding part, from a surface of at least one of the semiconductor chip and the connection target where the conductive member is to be connected, the protruding part being disposed on at least one of a bottom surface opposite to the main surface of the first bonding part and a bottom surface opposite to the main surface of the second bonding part.

5. The wiring structure according to claim 1, wherein
the third direction and the fourth direction are orthogonal to the main surfaces of the first and second bonding parts,
in the third direction, a sum of a width of the first wall section and a width of the second wall section at a position between the first and second bonding parts is set to be equal to or greater than a width in the second direction of the first bonding part or a width in the second direction of the second bonding part.

6. The wiring structure according to claim 5, wherein
in the third direction, the width of each of the first and second wall sections at a position between the first and second bonding parts is equal to or greater than at least one of a length of the first bonding part in the first direction or a length of the second bonding part in the first direction.

7. The wiring structure according to claim 1, wherein
the third direction is orthogonal to the main surfaces of the first and second bonding parts.

8. The wiring structure according to claim 1, wherein the first bonding part, the first joining part, and the second joining part are formed integrally.

9. The wiring structure according to claim 1, wherein the conductive member is to be connected to another connection target by a bonding wire that is connected to the bonding part at one end thereof and connected to the other connection target at the other end thereof and that is disposed between the first wall section and the second wall section.

10. A semiconductor module, comprising:
a semiconductor chip;
a connection target; and
a wiring structure including a conductive member electrically connecting the semiconductor chip to the connection target, wherein
the conductive member has one side and another side opposite to each other in a first direction and includes a first bonding part having a main surface that is flat and has two opposing sides extending in the first direction, the first bonding part being disposed at the one side of the conductive member and being bonded to the semiconductor chip,
a second bonding part having a main surface that is flat and has two opposing sides extending in the first direction, the second bonding part being disposed at the other side of the conductive member spaced from the first bonding part in the first direction and being bonded to the connection target, the main surface of the second bonding part extending continuously between the two opposing sides thereof in a second direction orthogonal to the first direction and parallel to the main surfaces of the first and second bonding parts, and
first and second joining parts respectively having first and second wall sections, the first joining part being directly connected to respective ones of the two opposing sides of the first and second bonding parts and extending in a third direction away from the main surfaces of the first and second bonding parts, the second joining part being directly connected to respective other ones of the two opposing sides of the first and second bonding parts and extending in a fourth direction away from the main surfaces of the first and second bonding parts, the first joining part having a flat surface parallel to a plane defined by the first and third directions, the second joining part having a flat surface parallel to the plane defined by the first and fourth directions, the flat surface of the first joining part and the flat surface of the second joining part facing each other, the flat surface of the first joining part and the flat surface of the second joining part being separated by a space that continuously extends in the first direction between the first bonding part and the second bonding part so as to overlap with the first and second wall sections as seen in a side view of the wiring structure;
wherein an angle between the main surface of the first bonding part and the flat surface parallel to a plane defined by the first and third directions or an angle between the main surface of the second bonding part and the flat surface parallel to a plane defined by the first and third directions is in a range of 90 degrees to 135 degrees, and
wherein an angle between the main surface of the first bonding part the flat surface parallel to a plane defined by the first and fourth directions or an angle between the main surface of the second bonding part and the flat surface parallel to a plane defined by the first and fourth is in a range of 90 degrees to 135 degrees.

11. The semiconductor module according to claim 10, wherein
the third direction is orthogonal to the main surfaces of the first and second bonding parts.

12. The semiconductor module according to claim 10, further comprising:
an insulating substrate; and
a first electrode pattern and a second electrode pattern that are disposed on the insulating substrate apart from each other in the first direction, the semiconductor chip being disposed on the first electrode pattern, the second electrode pattern being the connection target.

13. The semiconductor module according to claim 12, wherein
the semiconductor chip is provided in plurality, and
the first bonding part is provided in plurality respectively connected to respective ones of the plurality of semiconductor chips.

14. The semiconductor module according to claim 10, further comprising a bonding wire that is connected to the conductive member and to another connection target, and is disposed between the first joining part and the second joining part, the bonding wire being connected to the first bonding part at one end thereof and being connected to the other connection target at the other end thereof.

15. The semiconductor module according to claim 10, wherein
the semiconductor chip includes a temperature sensor, a sensor lead and a gate lead, and
the first bonding part has a slit at a position corresponding to a position where at least one of the temperature sensor, the sensor lead and the gate lead is provided on the semiconductor chip.

16. The semiconductor module according to claim 15, wherein
the slit formed in the first bonding part penetrates through the first bonding part and extends lengthwise in the first direction to divide the first bonding part into two parts, the wiring structure further comprising:

an auxiliary joining part that joins to each other the two parts of the first bonding part divided by the slit.

* * * * *